(12) United States Patent
Gritters

(10) Patent No.: US 8,115,504 B2
(45) Date of Patent: Feb. 14, 2012

(54) MICROSPRING ARRAY HAVING REDUCED PITCH CONTACT ELEMENTS

(75) Inventor: John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 26 days.

(21) Appl. No.: 12/339,919

(22) Filed: Dec. 19, 2008

(65) Prior Publication Data

US 2010/0141290 A1  Jun. 10, 2010

Related U.S. Application Data

(60) Provisional application No. 61/120,814, filed on Dec. 8, 2008.

(51) Int. Cl.
*G01R 31/00* (2006.01)
(52) U.S. Cl. .......... 324/755.07; 324/755.05; 324/755.11
(58) Field of Classification Search .................... None
See application file for complete search history.

(56) References Cited

U.S. PATENT DOCUMENTS

| | | | | |
|---|---|---|---|---|
| 3,702,439 A | * | 11/1972 | McGahey et al. | 324/757 |
| 5,673,477 A | * | 10/1997 | Hattori et al. | 29/825 |
| 6,255,126 B1 | | 7/2001 | Mathieu et al. | |
| 6,307,392 B1 | * | 10/2001 | Soejima et al. | 324/762 |
| 6,482,013 B2 | | 11/2002 | Eldridge et al. | |
| 6,616,966 B2 | | 9/2003 | Mathieu et al. | |
| 6,888,362 B2 | * | 5/2005 | Eldridge et al. | 324/757 |
| 7,230,437 B2 | | 6/2007 | Eldridge et al. | |
| 7,459,795 B2 | | 12/2008 | Eldridge et al. | |

OTHER PUBLICATIONS

FormFactor Press Release, "FormFactor Unveils New Addition to Wire Bond Logic Probe Card Family to Lower IC Test Costs for Mobile and Consumer Applications," Dec. 4, 2007.
TrueScale™ PP40 Product Brief, available Jan. 2008.
TrueScale™ PP40 Poster from Semicon Japan 2007, Dec. 5, 2007-Dec. 7, 2007.

* cited by examiner

*Primary Examiner* — Minh N Tang
(74) *Attorney, Agent, or Firm* — Kirton & McConkie

(57) ABSTRACT

Embodiments of microspring arrays and methods for fabricating and using same are provided herein. In some embodiments, a microspring array may include at least two lithographically formed resilient contact elements, each resilient contact element having a beam and a tip for contacting a device to be tested, wherein the beams extend in substantially the same direction relative to a first end of the beams, and wherein the ends of the at least two beams are separated by a distance defining a central region and wherein the respective tips of the at least two beams extend away from the beams in a non-zero, non-perpendicular direction into the central region.

30 Claims, 12 Drawing Sheets

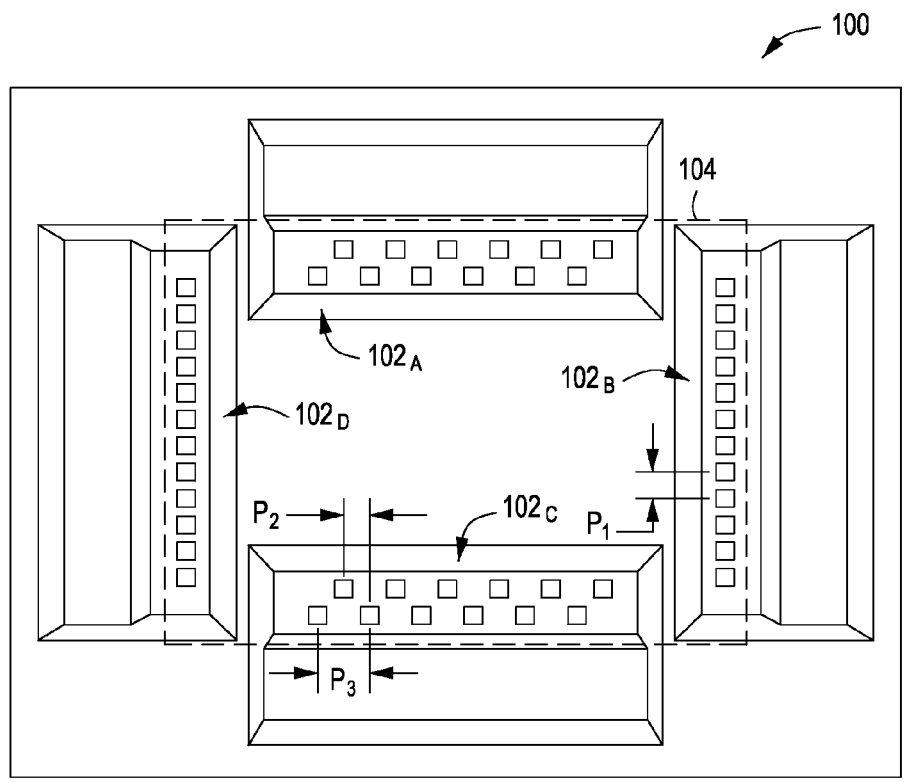
FIG. 1
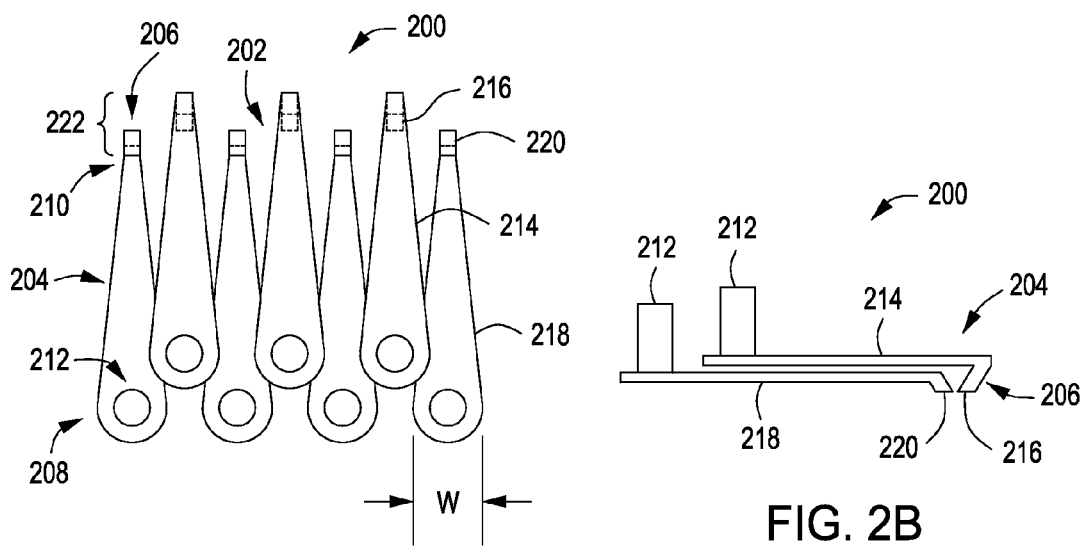
FIG. 2A
FIG. 2B

MICROSPRING ARRAY HAVING REDUCED PITCH CONTACT ELEMENTS

CROSS-REFERENCE TO RELATED APPLICATIONS

This application claims benefit of U.S. provisional patent application Ser. No. 61/120,814, filed Dec. 8, 2008, which is herein incorporated by reference.

BACKGROUND

1. Field

Embodiments of the present invention generally relate to semiconductor testing.

2. Description of the Related Art

Testing is an important step in the fabrication of semiconductor devices. Typically, partially or fully completed semiconductor devices are tested by bringing terminals disposed on an upper surface of a device to be tested—also referred to as a device under test (or DUT)—into contact with resilient contact elements, for example, as contained in a probe card assembly, as part of a test system. However, as the size of features formed on the DUT continue to be reduced, and/or spaced more closely together, problems arise with the scalability of the contact apparatus of the test system (for example, the resilient contact elements on the probe card). Such problems may be exacerbated by layout constraints of the testing equipment. For example, the layout of the terminals on the DUT may prevent the use of the testing apparatus for testing the DUT, or may require limiting testing of the DUT to fewer terminals at a time, thereby undesirably increasing the number of touchdowns and time to complete the testing. Moreover, many conventional designs are not scalable to smaller feature sizes due to architectures that are likely to buckle or move laterally upon shrinking the contact apparatus sufficiently to achieve the desired testing spacing.

Therefore, there is a need for an improved apparatus suitable for use in testing devices having smaller feature sizes.

SUMMARY

Embodiments of microspring arrays and methods for fabricating and using same are provided herein. In some embodiments, a microspring array may include at least two lithographically formed resilient contact elements, each resilient contact element having a beam and a tip for contacting a device to be tested, wherein the beams extend in substantially the same direction relative to a first end of the beams, and wherein the ends of the at least two beams are separated by a distance defining a central region and wherein the respective tips of the at least two beams extend away from the beams in a non-zero, non-perpendicular direction into the central region. In some embodiments, the respective tips of the at least two beams extend away from the beams in a non-zero direction into the central region.

In some embodiments, a probe card assembly may include a substrate; and a microspring array coupled to the substrate, the microspring array including at least two lithographically formed resilient contact elements, each resilient contact element having a beam and a tip for contacting a device to be tested, wherein the beams extend in substantially the same direction relative to a first end of the beams, and wherein the ends of the at least two beams are separated by a distance defining a central region and wherein the respective tips of the at least two beams extend away from the beams in a non-zero, non-perpendicular direction into the central region. In some embodiments, the respective tips of the at least two beams extend away from the beams in a non-zero direction into the central region.

In some embodiments, a method of fabricating a microspring array may include providing a substrate having a first trench; and forming a plurality of resilient contact elements having beams and tips on the substrate, wherein each of the tips in the plurality of resilient contact elements are at least partially defined by the first trench, and wherein tips of a first subset of the plurality of resilient contact elements are formed on a the first side of the first trench and tips of a second subset of the plurality of resilient contact elements are formed on a second side of the first trench, opposite the first side.

In some embodiments, a semiconductor device may be tested by a method that may include disposing a device opposite a probe card assembly comprising a substrate having a microspring array coupled thereto, the microspring array comprising at least two lithographically formed resilient contact elements, each resilient contact element having a beam and a tip for contacting a device to be tested, wherein the beams extend substantially in the same direction relative to a first end of the beams, and wherein the ends of the at least two beams are separated by a distance defining a central region and wherein the respective tips of the at least two beams extend away from the beams in a non-zero, non-perpendicular direction into the central region; contacting a plurality of terminals of the device with respective tips of the resilient contact elements; and providing one or more electrical signals to at least one of the terminals through the resilient contact elements.

BRIEF DESCRIPTION OF THE DRAWINGS

So that the manner in which the above recited features of the present invention can be understood in detail, a more particular description of the invention, briefly summarized above and others described below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 depicts an illustrative top view of a perimeter pad layout suitable to be tested with a microspring array having reduced pitch resilient contact element according to some embodiments the invention.

FIGS. 2A-B respectively depict top and side views of a microspring array having reduced pitch contact elements according to some embodiments of the invention.

Where possible, identical reference numerals are used herein to designate identical elements that are common to the figures. The images used in the drawings are simplified for illustrative purposes and are not necessarily depicted to scale.

DETAILED DESCRIPTION

Figure 3A:
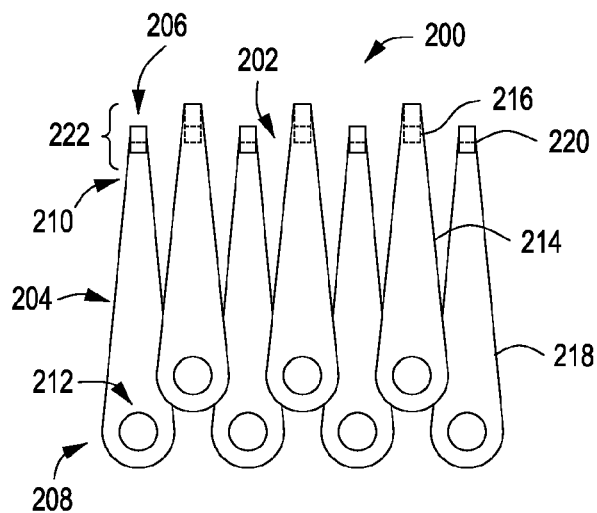
FIGS. 3A-B respectively depict top and side views of a microspring array having reduced pitch contact elements according to some embodiments of the invention.

This specification describes exemplary embodiments and applications of the invention. The invention, however, is not limited to these exemplary embodiments and applications or to the manner in which the exemplary embodiments and applications operate or are described herein. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one or more of the listed elements by itself or in any combination.

The present invention provides methods and apparatus suitable for testing devices having reduced contact feature sizes (e.g., 35 μm). The inventive apparatus and methods can provide increased contact element density and reduced pitch as compared to conventional testing apparatus, which can facilitate testing of devices having reduced contact feature sizes. For example, in some embodiments, an about 50 percent reduction in perimeter pad probing pitch may be provided. It is contemplated that the inventive apparatus and methods may also be used to advantage in testing devices having larger feature sizes as well. Embodiments of the present invention may further advantageously permit testing of terminals having various configurations, such as in-line or staggered pad probing.

For example, FIG. 1 depicts an illustrative top view of a perimeter pad layout 100 suitable to be tested with a microspring array having reduced pitch resilient contact element according to some embodiments the invention. The perimeter pad layout 100 includes a plurality of terminal arrays $102_{A-D}$. The individual terminals in any of the terminal arrays $102_{A-D}$, may have varying configurations. For illustration, two configurations are shown in FIG. 1, in-line (as depicted by terminal arrays $102_B$ and $102_D$) and staggered (as depicted by terminal arrays $102_A$ and $102_C$). Other configurations may also be utilized. In addition, the perimeter pad layout 100 depicted in FIG. 1 is illustrative only and many other configurations of perimeter pad layouts or other pad layouts may be tested using the inventive apparatus disclosed herein.

The terminals may be spaced apart by any distance as utilized in a particular application. However, in some embodiments, the terminals may have a pitch as low as 35 μm, or lower (for example, as device sizes continue to shrink). For example, in the terminal configuration depicted by the plurality of terminal arrays $102_B$ and $102_D$, the terminals may have a pitch $P_1$ (for example, 35 μm). In the terminal configuration depicted by the plurality of terminal arrays $102_A$ and $102_C$, the terminals may have a pitch $P_2$ measured between any two adjacent terminals in the plurality (for example, 35 μm) and a pitch $P_3$ measured between any two adjacent terminals in a given row (for example, 70 μm). Other pitches and other configurations may also be utilized.

The position of the terminals in the plurality of terminal arrays $102_{A-D}$ may define a DUT perimeter 104 that bounds the available area for the test apparatus to probe the terminals. In some embodiments, the DUT perimeter 104 may be too small for conventional testing apparatus to either fit within the perimeter or to test all of the terminals within the perimeter in a single touchdown. As such, a microspring array having a reduced pitch may be provided to facilitate testing the terminals within the DUT perimeter 104, or testing the terminals within the DUT perimeter 104 more efficiently.

For example, FIGS. 2A-B respectively depict top and side views of a microspring array 200 having reduced pitch contact elements according to some embodiments of the invention. The microspring array 200 includes a plurality of resilient contact elements 202, each contact element 202 having a beam 204 and a tip 206 for contacting a device to be tested. A post 212 for supporting each beam 204 may be coupled thereto proximate a first end 208 of the beam 204. The tip 206 may be disposed proximate a second end 210 of the beam 204, opposite the first end 208.

The plurality of resilient contact elements 202 may include at least a first beam 214 having a tip 216 and at least a second beam 218 having a tip 220. The first and second beams 214, 218 may be arranged such that they extend in a substantially common direction (e.g., a direction extending from respective first ends 208 of the beams to the respective second ends 210 of the beams is the same, or substantially the same). As used herein, substantially the same means within 45 degrees of parallel.

The first and second beams 214, 218 may be offset from each other such that they may be spaced as desired with respect to each other without interfering with each other. For example, in the top and side views respectively shown in FIGS. 2A-B, the first beam 214 may be positioned forward of and above the second beam 218 (illustratively using the frame of reference of the drawings). The second end 210 of the first beam 214 may extend past the second end 210 of the second beam 218 to define a central region 222 corresponding to a location of terminals to be tested (for example, corresponding to the location of one of the terminal arrays $102_{A-D}$ disclosed in FIG. 1).

In some embodiments, the first and second beams 214, 218 may be supported at respective first ends 208 disposed on a common side with respect to a location of terminals to be tested and have respective second ends 210 that extend in a direction towards the location of the terminals to be tested. The first beam 214 may be configured to extend beyond a point corresponding to a location of a terminal to be contacted by the tip 216 of the first beam 214 such that the tip 216 of the first beam 214 extends away from the first beam 214 at a non-perpendicular angle toward the location of the terminal to be contacted by the tip 216. The second beam 218 may be configured to terminate prior to reaching a point corresponding to a location of a terminal to be contacted by the tip 220 of the second beam 218 such that the tip 220 of the second beam 218 extends away from the second beam 218 at a non-perpendicular angle toward the location of the terminal to be contacted by the tip 220. From the frame of reference of the terminals to be contacted, the first and second beams 214, 218 straddle the terminals such that their respective tips extend in substantially opposite directions towards terminals disposed beneath and between the respective ends of the first and second beams 214, 218 (e.g., terminals disposed below the central region 222).

Figure 3B:
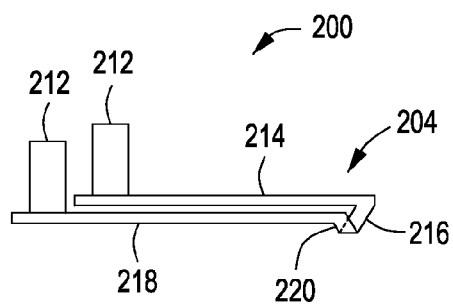

The width of the central location 222 (e.g., the difference between respective second ends 210 of the first and second beams 214, 218), the length of the tips 216, 220, and the angle of the tips 216, 220 may be configured to locate the end of the tips 216, 220 in a desired position corresponding to the terminals that are to be tested. For example, as illustratively shown in FIGS. 2A-B, the tips 216, 220 may extend in opposite directions along the respective axial lengths of the first and second beams 214, 218 toward the central location 222 and terminate in an offset, or staggered pattern (corresponding to terminal arrays $102_A$ and $102_C$ depicted in FIG. 1). As illustratively shown in FIGS. 3A-B, the tips 216, 220 may extend in opposite directions along the respective axial lengths of the first and second beams 214, 218 toward the central location 222 and terminate in linear pattern (corresponding to terminal arrays $102_B$ and $102_D$ depicted in FIG. 1). It is contemplated that other configurations of beam lengths, tip lengths, angles of the tips, and the like, may be utilized to provide a microspring array having tips located to correspond with terminal locations for a particular application.

Each of the beams 204 typically have a spring constant and yield strength suitable for developing sufficient contact force when contacting a DUT (e.g., sufficient to establish a reliable, temporary electrical contact with the terminals of the DUT) and for repeated contacting of DUT terminals without permanent deformation. In some instances a plurality of the beams across a probing surface may be compliant enough to allow sufficient overtravel to facilitate suitably contacting a plurality of contact elements to the DUT, which may be at different heights or wherein the tips may be at different heights. Overtravel refers to the continued movement of the DUT towards the probe card assembly after the initial contact of the first resilient contact element to contact the DUT due to one or both of the non-planarity of the respective tips of the resilient contact elements disposed on the probe card assembly and variations in the heights of the terminals of the DUT. In a non-limiting exemplary range, the amount of overtravel may be between about 1-4 mils (about 25.4-102 μm). In some embodiments, the beams 204 may have a spring constant in a non-limiting exemplary range of between about 0.2-5 grams force per mil of movement. In some embodiments, the contact force developed during testing may be less that about 5 grams force, or in some embodiments between about 0.2-5 grams force. It is contemplated that the beams 204 may have other spring constants for applications where lesser or greater contact forces are required to establish reliable temporary electrical contact with the DUT without damaging either the resilient contact element or the DUT. Moreover, it is contemplated that as dimensions of the features being tested on a DUT continue to shrink, the specific dimensions, spring constants, overtravel requirements, and the like for the resilient contact elements 202 of the microspring array 200 may change while still remaining within the scope of this invention.

The spring constant and yield strength of the resilient contact elements 202 may be controlled at least in part by the geometry and material selection for the beams 204. For example, the width, W, of any of the beams 204 may be uniform or may vary along the length of the beam 204. In some embodiments, and as shown in FIGS. 2A-B and 3A-B, the width W may be greater proximate a first end 208 of the beam 204 and may gradually taper towards a second end 210 of the beam 204. In some embodiments, the width, W, may vary along the length of the beam 204. Variation of the width W of the beam 204 may be selectively controlled in order to facilitate control of the spring constant of the resilient contact element 202 and/or performance characteristics of the resilient contact element 202. The variation of the width of the beam 204 may further be selectively controlled to form a geometry suitable for providing a plurality of resilient contact elements in an array having a first pitch proximate the tips of the resilient contact elements that is smaller than a pitch of a plurality of contact pads formed on a DUT, and a second pitch proximate the second ends of the beams to facilitate connection to a support, such as a probe card assembly, as discussed below with respect to FIG. 8. In some embodiments, the width of the first end 208 of the beam 204 can be about 2 or more times greater than the width of the second end 210 of the beam 204.

The resilient contact elements 202 may be fabricated from suitable materials to provide desired mechanical and electrical properties (e.g., spring constants, resultant contact force, electrical conductance, or the like). For example, the beams 204 may comprise one or more layers and may comprise one or more electrically conductive and/or nonconductive materials. Examples of suitable conductive materials include metals. In some embodiments, the beams 204 may comprise nickel, copper, cobalt, iron, gold, silver, elements of the platinum group, noble metals, semi-noble metals, elements of the palladium group, tungsten, molybdenum, beryllium, and the like, and alloys thereof (such as nickel-cobalt alloys, palladium cobalt alloys, copper-beryllium alloys, and the like).

The tip 206 may be coupled to the beam 204 at a second end 210 thereof, and extends downward at a non-perpendicular angle therefrom. In some embodiments, the tip 206 may be formed integrally with the beam 204. The tip 206 may be configured to locate the tip 206 in a desired position suitable for contacting a terminal of a device to be tested or the like (for example, the length and angle of the tip with respect to the beam 204 may be selected to position the end of the tip as desired).

The tip 206 may be fabricated from the same materials as the beam 204 or may be fabricated from different materials, thereby decoupling the contact requirements of the tip 206 from spring constant requirements of the beam 204. The tip 206 may comprise materials of suitable hardness and conductivity to provide the required contact with the DUT, as described above. In some embodiments, the tip 206 may be fabricated from noble metals and semi-noble metals, such as palladium, gold, rhodium, and combinations or alloys thereof (such as palladium-cobalt, nickel-cobalt, nickel-palladium, or the like), and the like.

The tips 206 may be configured to wipe a contact surface of the terminals of the DUT during testing. The term "wipe" may be defined as lateral movement of the tip across the contact surface of the terminal after initial contact with the terminal (e.g., the tip initially contacts the terminal at a first point, then wipes the surface of the terminal as it moves to a second point). Thus, the term "wipe" includes any post-contact motion between tips and terminals such that physical, frictional relative motion therebetween is developed. As used herein, the term "contact" includes any initial contact sufficient to establish electrical connection between tips and terminals and any additional motion of either or both of the tips or the terminals sufficient to induce wipe therebetween.

Figure 8:
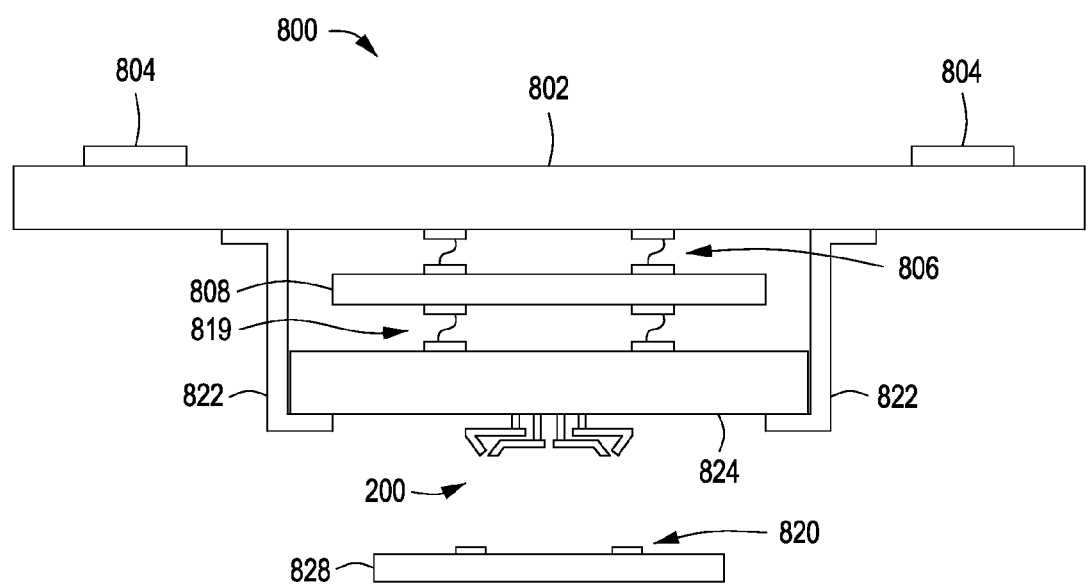
FIG. 8 depicts a schematic side view of a probe card assembly having a resilient contact element according to some embodiments of the invention.

The post 212, coupled to the beam 204 proximate the first end 208 of the beam 204, may be configured to support the resilient contact element 202 (for example to couple the resilient contact elements 202 to a probe card assembly, as discussed below with respect to FIG. 8) and can provide an electrical pathway to facilitate electrical communication between the tip 206 and a test system (discussed in more detail below with respect to FIG. 8). Accordingly, the post 212 typically comprises a stiff, conductive material that has minimal or no deformation or deflection during operation (e.g., materials having a high Young's modulus). Examples of suitable materials include metals or metal coated materials. The post 212 may be formed and/or coupled to the beam 204 by any suitable method, such as by lithographic techniques, soldering, wirebonding and overplating, molding and electroplating, or the like.

The dimensions and materials described herein for the resilient contact elements 202 of the microspring array 200 are exemplary only. It is contemplated that resilient contact elements as described herein may have other dimensions or be made from alternate materials suited for particular applications in accordance with the teachings provided herein. For example, the dimensions of the resilient contact element may be selected to meet certain design characteristics, such as matching the pitch and geometrical configuration of contact pads on a DUT and generating sufficient contact force to establish reliable temporary electrical contact therewith.

Figure 4A:
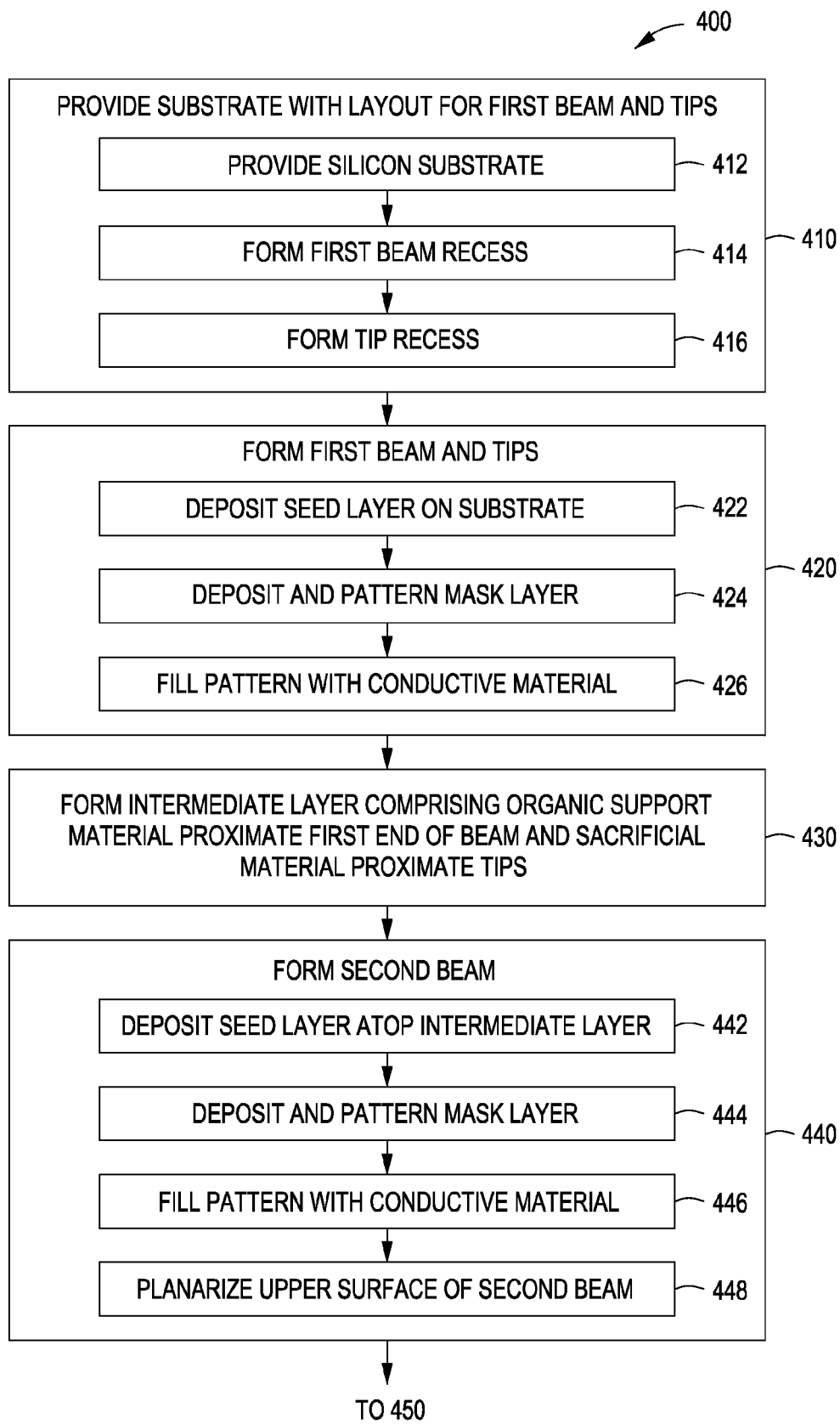
FIG. 4 depicts a flow chart of a method of fabricating a microspring array having reduced pitch contact elements in accordance with some embodiments of the invention.
Figure 4B:
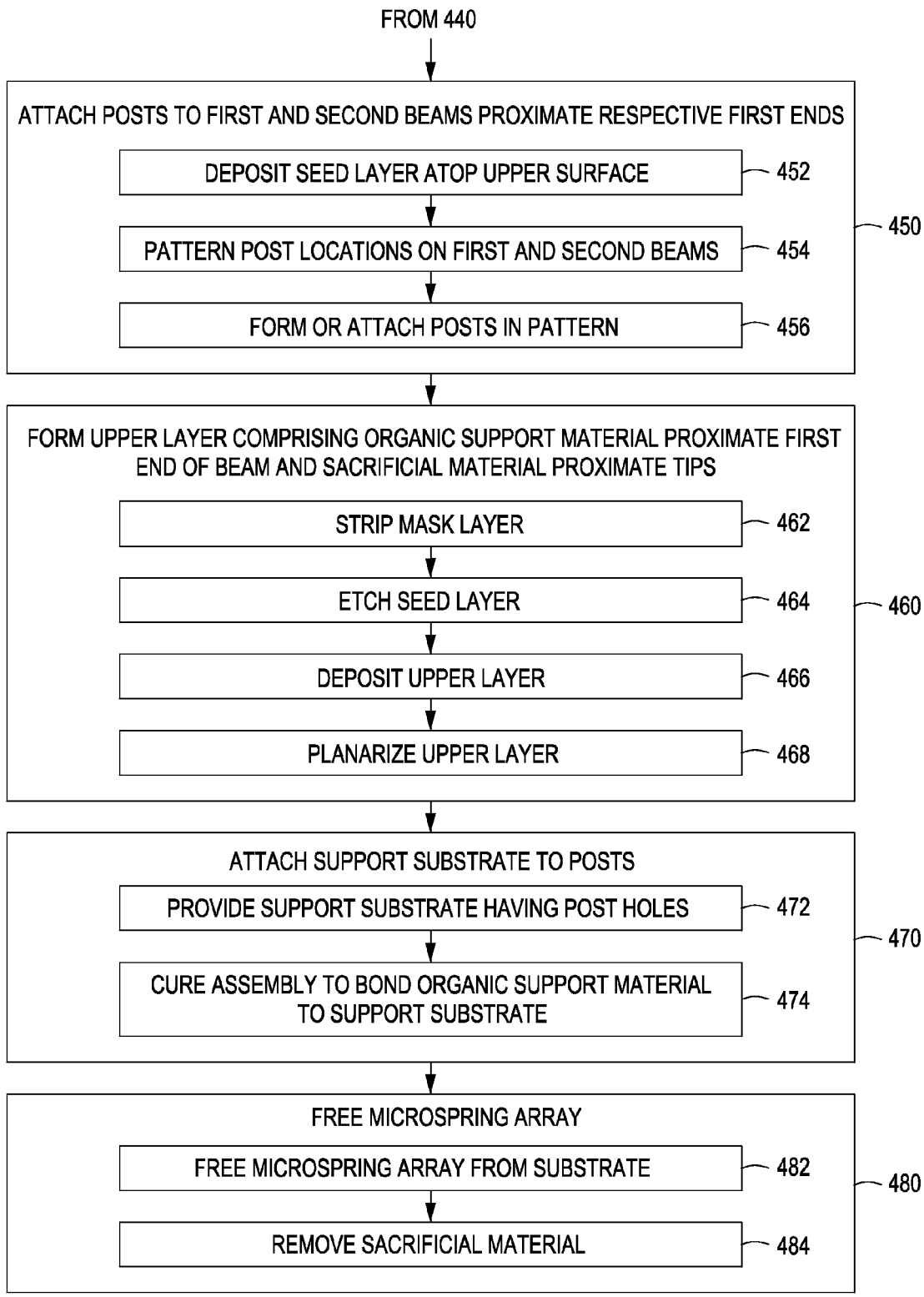

In addition to the inventive microspring arrays described above, embodiments of the present invention further provide various fabrication processes for constructing the microspring arrays. For example, FIGS. 4 and 5A-I respectively depict a process flow chart and illustrative stages of fabrication of a microspring array in accordance with some embodiments of the present invention. FIG. 4 depicts a process 400 for fabricating a microspring array 500 (as shown in FIGS. 5A-I) in accordance with some embodiments of the invention and similar to microspring array 200 discussed above. To more easily understand aspects of the present invention, the following discussion with respect to FIGS. 4-5 reflect the fabrication of a pair of resilient contact elements of the microspring array.

Although the fabrication of a pair of resilient contact elements is shown in the figures, it is contemplated that the microspring array may have any number of resilient contact elements that may be simultaneously fabricated on a substrate utilizing any of the following methods. Moreover, although shown schematically in cross-section, the portions of the microspring array shown in any figure may not be aligned in the plane of the drawing (for example, as discussed above with respect to the offset first and second beams of FIGS. 2A-B and 3A-B), and may have uniform or non uniform profiles (for example, the beams may have a tapered width, as discussed above with respect to FIGS. 2A-B and 3A-B). Accordingly, although the following discussion generally details the vertical construction of the microspring array from a side view thereof (in the frame of reference of the drawings), it is understood that the geometry of the microspring array may include any number of resilient contact elements (for example extending into or out of the page), having similar or varying configurations as discussed above.

Figure 5A:
FIGS. 5A-I depict schematic side views of stages of fabrication of a microspring array having reduced pitch contact elements in accordance with some embodiments of the invention.
Figure 5B:
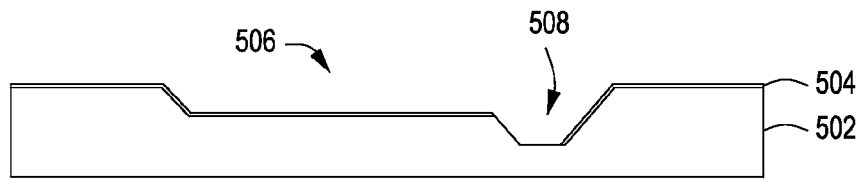

The exemplary process 400 begins at 402 wherein a substrate 502 can be provided having a first beam recess 506, as shown in FIG. 5A, and a tip recess 508, as shown in FIG. 5B. As noted above, the first beam recess 506 and/or the tip recess 508 may have widths suitable for simultaneously fabricating a number of resilient contact elements of the microspring array (e.g., the first beam recess 506 and/or the tip recess 508 may be a trench formed in the substrate). The substrate 502 may comprise any suitable substrate, and in some embodiments comprises silicon. The substrate 502 may further have an oxide layer 504 formed at least partially thereover. In some embodiments, the substrate 502 may be provided with the first beam recess 506 and the tip recess 508.

Figure 9A:
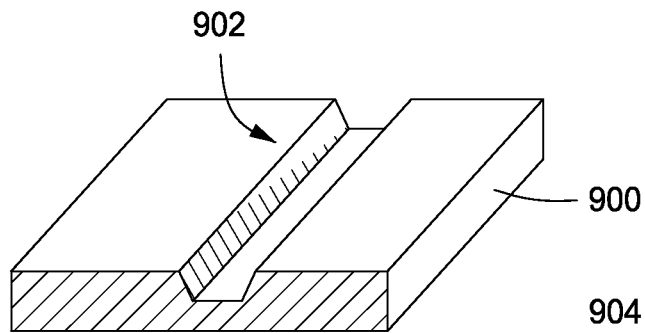
FIGS. 9A-C depict schematic perspective views of trench configurations in a substrate suitable for use in connection with microspring array fabrications methods in accordance with some embodiments of the invention.
Figure 9B:
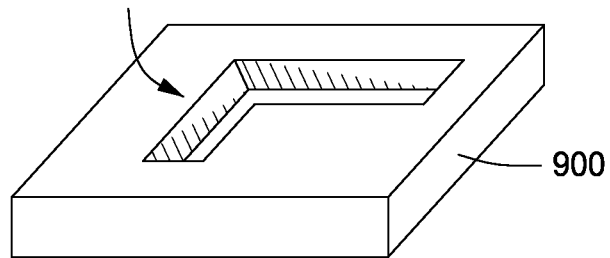
Figure 9C:
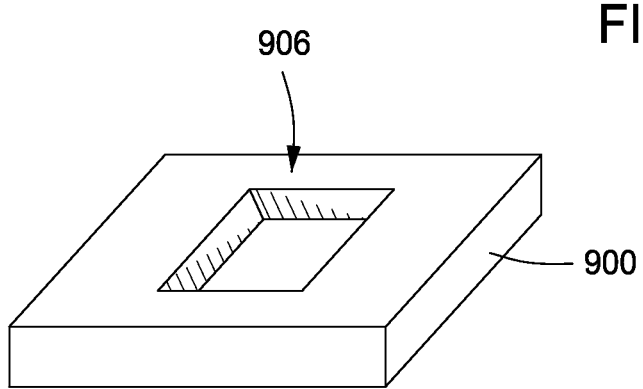

In some embodiments, and as discussed in more detail below with respect to FIGS. 10A-C and 11, a substrate may be provided with either only a tip recess, or a tip recess and a first beam recess. In addition, the beam recess and/or the tip recess may form a trench (or trenches) in the substrate suitable for forming a plurality of resilient contact elements (e.g., a microspring array) therein. For example, in some embodiments and as depicted in FIG. 9A, a substrate 900, similar to the substrate 200, may be provided having a tip recess 902 formed therein. The tip recess 902 defines a linear trench in which the tips of a plurality of resilient contact elements of a microspring array may be fabricated in accordance with the teachings provided herein. In some embodiments, and as depicted in FIG. 9B, the substrate 900 may have a tip recess 904 formed therein. The tip recess 904 defines a trench that extends in two directions (e.g., along an x and a y axis with reference to the surface of the substrate) and in which the tips of a plurality of resilient contact elements of a microspring array may be fabricated in accordance with the teachings provided herein. In some embodiments, and as depicted in FIG. 9C, the substrate 900 may have a tip recess 906 formed therein. The tip recess 906 defines a large area trench having a perimeter along which the tips of a plurality of resilient contact elements of a microspring array may be fabricated in accordance with the teachings provided herein. It is contemplated that tip recesses defining trenches having varying geometries may be provided for fabricating microspring arrays having desired layouts, tip positions, tip geometries, and the like.

Returning to FIGS. 4 and 5A, in some embodiments, a blank substrate 502 may be provided, as shown at 412, and the first beam recess 506 may be formed therein, as shown at 414. The first beam recess 506 may have angled sidewalls and may be formed in the substrate 502 by any suitable process. For example, in some embodiments, the substrate 502 may be oxidized to form an oxide layer 504 thereover. Next, a mask layer (not shown) may be deposited and patterned to define an area where the first beam recess is to be formed. The oxide layer 504 exposed through the mask layer pattern may then be removed, for example, by etching. The first beam recess 506 may then be formed in the substrate 504 by any suitable process, such as a silicon etch process. One example of a suitable silicon etch process that may be utilized to form the angled sidewalls is a wet etch with a solution of potassium hydroxide (KOH). In embodiments where the oxide layer acts as an etch mask for the silicon etch process, the mask layer be removed prior to etching the first beam recess 506 by any suitable process, for example, by stripping.

At 416, the tip recess 508 may be formed in the substrate 502 using similar processes as discussed above with respect to the first beam recess 506 (e.g., oxidizing the substrate 502, forming and patterning a mask layer atop the substrate to define the tip recess, etching the oxide layer, and etching the tip recess 508 into the substrate 502). The tip recess 508 may be geometrically configured to correspond to the tips the first beams and the second beams of the microspring array (as discussed above with respect to FIGS. 2A-B and 3A-B). Although FIGS. 5A-B illustrate one type of beam recess 506 and tip recess 508, other recess geometries for forming other types of beams and/or tips may similarly be used in various embodiments of the invention.

Next, at 420, a first beam and tips may be formed at least partially within the first beam recess 506 and the tip recess 508. In some embodiments, prior to the formation of the first beam and tips, a seed layer 512 may be deposited over the substrate 502, including within the first beam recess 506 and the tip recess 508, as shown at 422 and in FIG. 5C. The seed layer 512 typically comprises a material that facilitates subsequent deposition of the material to be utilized to form the first beam and the tips in the first beam recess 506 and the tip recess 508. The seed layer 512 may be deposited, for example, by chemical or physical vapor deposition (CVD or PVD), atomic layer deposition (ALD), or like methods. Non-limiting examples of suitable materials for the seed layer 512 include any conductive material or materials conducive to the plating process (e.g., conductive materials that provide a suitable plating finish). In some embodiments, the seed layer 512 may comprise gold. In one non-limiting example, the seed layer may comprise a layer of gold formed to a thickness of about 2 μm.

Figure 5C:
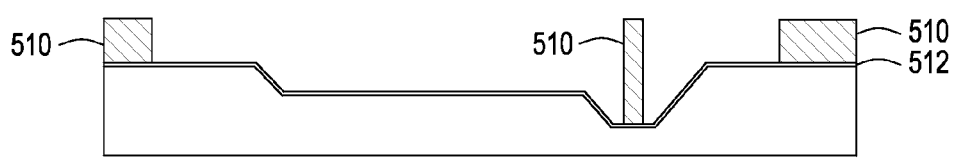
Figure 5D:
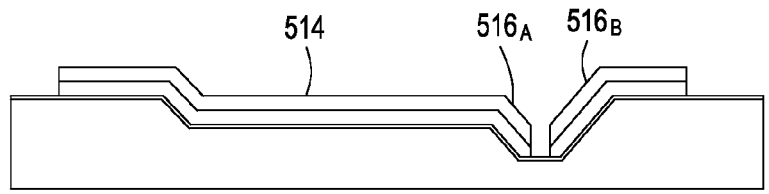

As shown at 424 and in FIG. 5C, a patterned mask layer 510 may be provided to define the first beam and the tips. The patterned mask layer 510 may be formed in any suitable manner, such as by depositing and patterning a layer of dry film or liquid photoresist material atop the substrate 502 (all other mask layers described herein may be formed using materials and techniques similar to mask layer 510 unless stated otherwise). In some embodiments, the seed layer 512 may be deposited over the patterned mask layer 510 and into the first beam recess 506 and the tip recess 508 rather than prior to formation of the patterned mask layer 510.

At 426, the pattern may be filled with a conductive material to define the first beam 514 and the tips $516_A$ and $516_B$. The first beam 514 and the tips $516_A$ and $516_B$ may be formed in any suitable manner, such as by plating or the like. Suitable non-limiting examples of materials which could be used for the first beam 514 and the tips $516_{A-B}$ include the materials discussed above with respect to FIGS. 2A-B and 3A-B. In some embodiments, multiple layers of materials may be utilized to form the first beam 514 and the tips $516_{A-B}$. For example, in some embodiments a first layer of conductive material may be formed within the pattern of the mask layer 510, such as a layer of a palladium-cobalt alloy, and a second layer of conductive material may be formed thereover, such as a layer of a nickel-cobalt alloy. It is contemplated that other materials or numbers of layers may also be utilized, including the use of non-conductive materials (so long as an electrical pathway is provided from the tip of the resilient contact element to the testing apparatus, as described in more detail below with respect to FIG. 8). In some embodiments, a layer of gold (not shown) may be formed, for example by plating, atop the first beam 514 and the tips $516_{A-B}$.

The first beam 514 and the tips $516_{A-B}$ are generally formed to a thickness suitable to ensure uniform coverage and, for example, to provide desired mechanical and electrical properties, as discussed above. For example, in a non-limiting example, the first beam and the tips may be provided having a thickness from between about 10 to 20 μm. Upon completion of forming the first beam 514 and the tips $516_{A-B}$, the patterned mask layer 510 may be removed by any suitable process, such as by stripping.

Figure 5E:
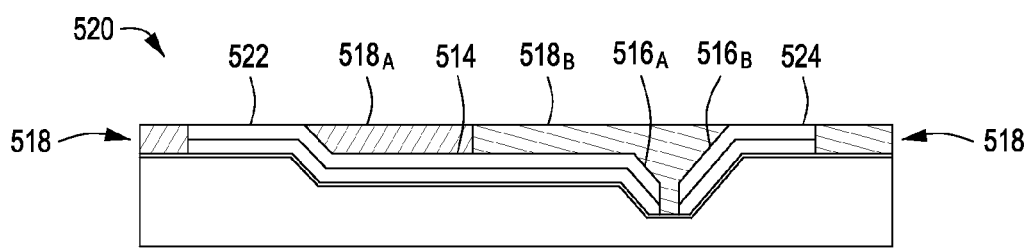

Next, at 430, an intermediate layer 518 may be formed to encapsulate the first beam 514 and the tips $516_{A-B}$, as shown in FIG. 5E. The intermediate layer 518 may include an organic support material $518_A$ proximate a first end 520 of the first beam 514 and a sacrificial material $518_B$ proximate the tips $516_{A-B}$. The organic support material $518_A$ may be any suitable material that can withstand further processing and can support the first beam 514 and a second beam to be formed, as described below. In some embodiments, the organic support material $518_A$ may be an epoxy or silicone encapsulating resin, such as glob top or underfill. The sacrificial material $518_B$ may be any suitable material that can withstand further processing, as discussed below, until it is desired to remove the sacrificial material (for example, during a final silicon etch to free the microspring array from the substrate 502). The sacrificial material $518_B$ may comprise a material that is substantially inert to the materials that form the beams and the tips of the microspring array and that may be removed without damaging the beams and the tips of the microspring array. In some embodiments, the sacrificial material $518_B$ may be trelibond.

After deposition, an upper surface of the intermediate layer 518 may be planarized to remove excess organic support material $518_A$ and sacrificial material $518_B$ and to expose an uppermost surface 522 of the first beam 514 and an uppermost surface 524 of the tip $516_B$. The intermediate layer 518 may be planarized by any suitable process, such as lapping, chemical mechanical polishing (CMP), electrochemical mechanical polishing (ECMP), or the like. In some embodiments, a thin layer of nickel and/or gold (not shown) may be formed, for example by strike plating, atop the uppermost surface 522 of the first beam 514 and an uppermost surface 524 of the tip $516_B$.

Figure 5F:
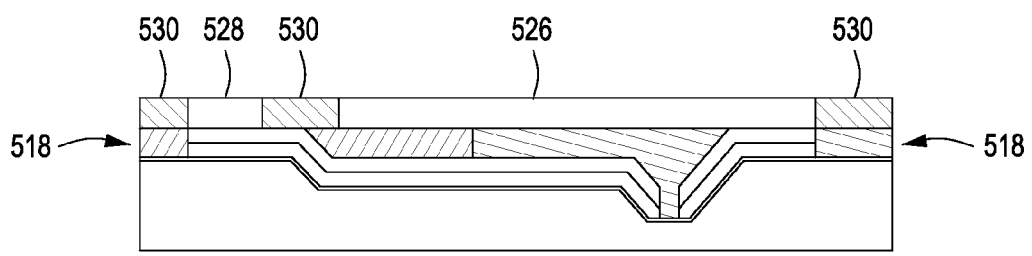

Next, at 440, a second beam 526 and a post spacer 528 may be formed atop the intermediate layer 518, exposed uppermost surface 522 of the first beam 514, and the uppermost surface 524 of the tip $516_B$, as shown in FIG. 5F. In some embodiments, as shown at 442, a seed layer (not shown) may be deposited atop the intermediate layer 518, exposed uppermost surface 522 of the first beam 514, and the uppermost surface 524 of the tip $516_B$. The seed layer typically comprises a material that facilitates subsequent deposition of the material to be utilized to form the second beam 526 and the post spacer 528 and may be formed in a similar manner as discussed above with respect to forming the seed layer 512. In some embodiments, the seed layer may comprise gold. In one non-limiting example, the seed layer may comprise a layer of gold formed to a thickness of about 2 μm.

At 444, a mask layer 530 may be deposited and patterned atop the seed layer to define an opening for the second beam 526 and the post spacer 528. In some embodiments, the mask layer 530 may be formed atop the intermediate layer 518, exposed uppermost surface 522 of the first beam 514, and the uppermost surface 524 of the tip $516_B$, and a seed layer may be subsequently deposited atop the patterned mask layer 530 and into the openings formed therein. The mask layer 530 may be formed by similar materials and techniques as discussed above with respect to the mask layer 510.

At 446, the second beam 526 and the post spacer 528 may be formed by depositing material within the patterned mask layer 530 and atop the seed layer (when present) to a desired thickness. Suitable non-limiting examples of materials which could be used for the beam include the materials discussed above with respect to FIGS. 2A-B and 3A-B. In some embodiments, a single layer of material may be utilized to form the second beam 526 and the post spacer 528. For example, in some embodiments a layer of conductive material may be formed within the patterned mask layer 530, such as a layer of a nickel-cobalt alloy. It is contemplated that other materials or numbers of layers may also be utilized, including the use of non-conductive materials (so long as an electrical pathway is provided from the tip of the resilient contact element to the testing apparatus, as described in more detail below with respect to FIG. 8). For example, in some embodiments, multiple layers of conductive materials may be used (similar to as discussed above with respect to the fabrication of the first beam 514 and the tips $516_{A-B}$) to control the stress build-up and distribution in the second beam 526 (e.g., to prevent undesired deflection of the beam upon freeing the beam). In some embodiments, a thin layer of nickel and/or gold (not shown) may be formed, for example by strike plating, atop the second beam 526 and the post spacer 528.

The second beam 526 and the post spacer 528 may generally be formed to a thickness suitable to ensure uniform coverage and, for example, to provide desired mechanical and electrical properties for the second beam 526 and the post spacer 528, as discussed above. For example, in a non-limiting example, the second beam 526 and the post spacer 528 may be formed to a thickness of between about 10 to 20 µm.

Upon depositing the second beam 526 and the post spacer 528 to the desired thickness, an upper surface of the second beam 526 and the post spacer 528 may be planarized to remove any excess material and to provide a flat surface for further processing, as shown at 448. The second beam 526 and the post spacer 528 may be planarized by any suitable process, such as lapping, chemical mechanical polishing (CMP), electrochemical mechanical polishing (ECMP), or the like.

Figure 5G:
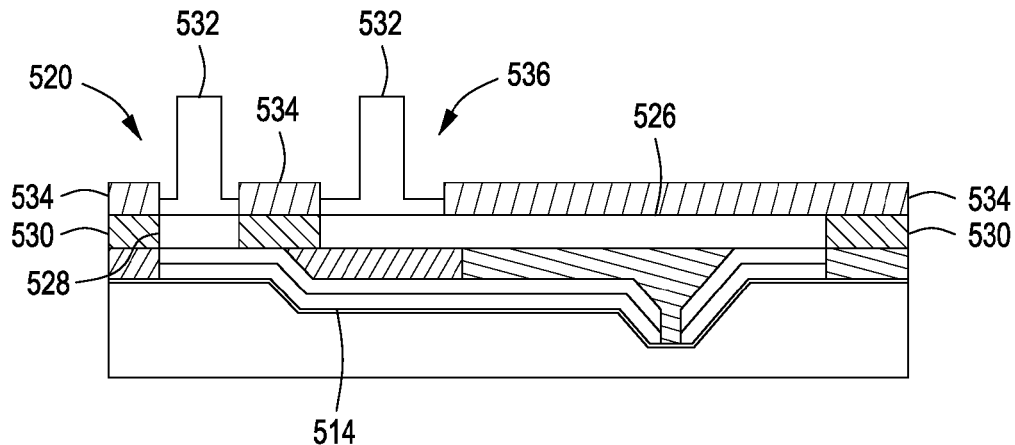

Next, at 450, posts 532 may be attached to the first and second beams 514, 526 proximate the first end 520 of the first beam 514 and a first end 536 of the second beam 526, as shown in FIG. 5G. The post 532 may be attached any suitable manner, such as by soldering, brazing, wire-bonding, molding, or the like. For example, in some embodiments, as shown at 452 a seed layer (not shown) may be deposited atop an upper surface of the second beam 526 and the post spacer 528 using materials and techniques similar to those described above. At 454, a mask layer 534 may be deposited and patterned to define post locations proximate respective first ends 520, 536 of the first and second beams 514, 526 where the posts 532 will be attached. The mask layer 534 may be deposited atop the mask layer 530, as shown in FIG. 5G, or alternatively, the mask layer 530 may be stripped and a new mask layer may be deposited and patterned to yield the configuration shown in FIG. 5G. At 456, the posts 532 may be formed or attached to the through the openings in the patterned mask layer 534. For example, in some embodiments, a wire (not shown) may be bonded to the first and second beams 514, 526 (e.g., to the upper surfaces of the second beam 526 and the post spacer 528 through the patterned mask layer 534) and subsequently over-coated and planarized to form the posts 532.

Alternatively, the posts 532 may be affixed to the first and second beams 514, 526 by solder or some other bonding agent. Alternatively, a structure (not shown) may be molded onto the first and second beams 514, 526 and subsequently electroplated to form the posts 532. It is contemplated that the posts 532 may alternatively be affixed to the first and second beams 514, 526 subsequent to the removal of the microspring array from the substrate 502 utilizing any of the above methods.

Figure 5H:
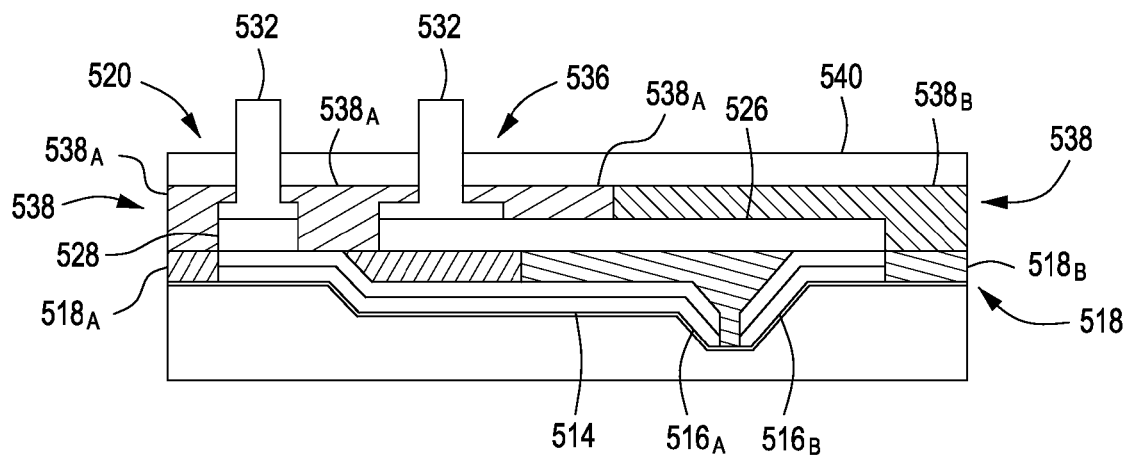

Next, at 460, an upper layer 538 may be formed to encapsulate the second beam 526 and the post spacer 528, as shown in FIG. 5H. The upper layer 538 may include an organic support material $538_A$ proximate the first end 520 of the first beam 514 and a sacrificial material $538_B$ proximate the tips $516_{A-B}$. The organic support material $538_A$ may be the same or similar materials as discussed above with respect to organic support material $518_A$. In some embodiments, the organic support material $538_A$ may be the same as the organic support material $518_A$. The sacrificial material $538_B$ may be the same or similar materials as discussed above with respect to the sacrificial material $518_B$. In some embodiments, the sacrificial material $538_B$ may be the same as the sacrificial material $518_B$.

In some embodiments, prior to forming the upper layer 538, the mask layer 530 (if present) and the mask layer 534 may be stripped using any suitable process as discussed above, as shown at 462. At 464, the seed layer deposited at 442 atop the intermediate layer 518 (if present) may be etched away to facilitate forming the upper layer 538 atop the intermediate layer 518. At 466, the upper layer 538 may be deposited using the materials discussed above for the organic support material $538_A$ and the sacrificial material $538_B$. At 468, upon forming the upper layer 538 to a desired thickness to encapsulate the second beam 526 and the post spacer 528, an upper surface of the upper layer 538 may be planarized to remove any excess material and to provide a flat surface for further processing, as shown at 448. The upper layer 538 may be planarized by any suitable process, such as lapping, chemical mechanical polishing (CMP), electrochemical mechanical polishing (ECMP), or the like.

Next, at 470, a support substrate 540 may be attached to the posts 532. The support substrate may be, for example, a support substrate utilized as a temporary support or to attach the completed microspring array to a probe card assembly or other testing apparatus, as discussed below with respect to FIG. 8. In some embodiments, the support substrate 540 may be a ceramic tile. As shown at 472, a support substrate 540 may be provided having holes formed therethrough that correspond to locations of the posts 532. The support substrate 540 may be placed atop the upper layer 538 with the posts 532 extending through the holes of the support substrate 540 (as shown in FIG. 5H). Next, at 474, the microspring array assembly may be cured to bond the organic support material $538_A$ to the support substrate 540. In some embodiments, the microspring array assembly may be cured, for example at a temperature of between about 100-175 degrees Celsius for a period of time sufficient to cure the organic support materials $518_A$, $538_A$.

Figure 5I:
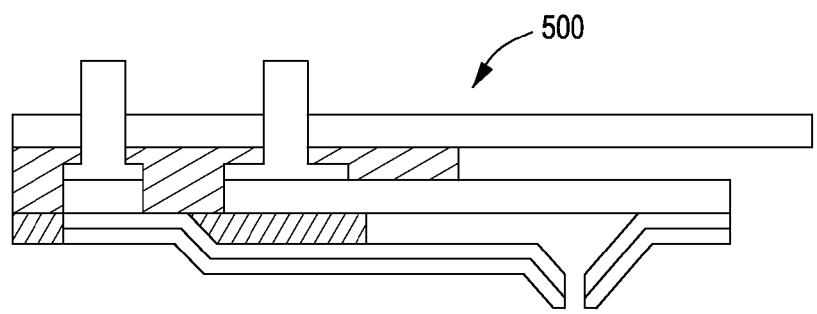

Next, at 480, the microspring array 500 may be freed from the substrate 502, as shown in FIG. 5I. For example, at 482, the microspring array 500 may be freed from the substrate 502, for example, by etching the silicon away from the first beam 514, tips $516_{A-B}$, and intermediate layer 518. At 484, the sacrificial material $518_B$ may be removed. In some embodiments, the sacrificial material $518_B$ may be removed during the silicon etch process utilized to free the microspring array 500. In some embodiments, the support substrate 540 may be singulated to separate the microspring array 500 from other microspring arrays being simultaneously formed. Upon release of the microspring array 500 from the substrate 502, the process 400 ends and the microspring array 500 may be utilized, for example, as part of a probe card assembly for testing devices, as discussed below with respect to FIG. 8.

Figure 6A:
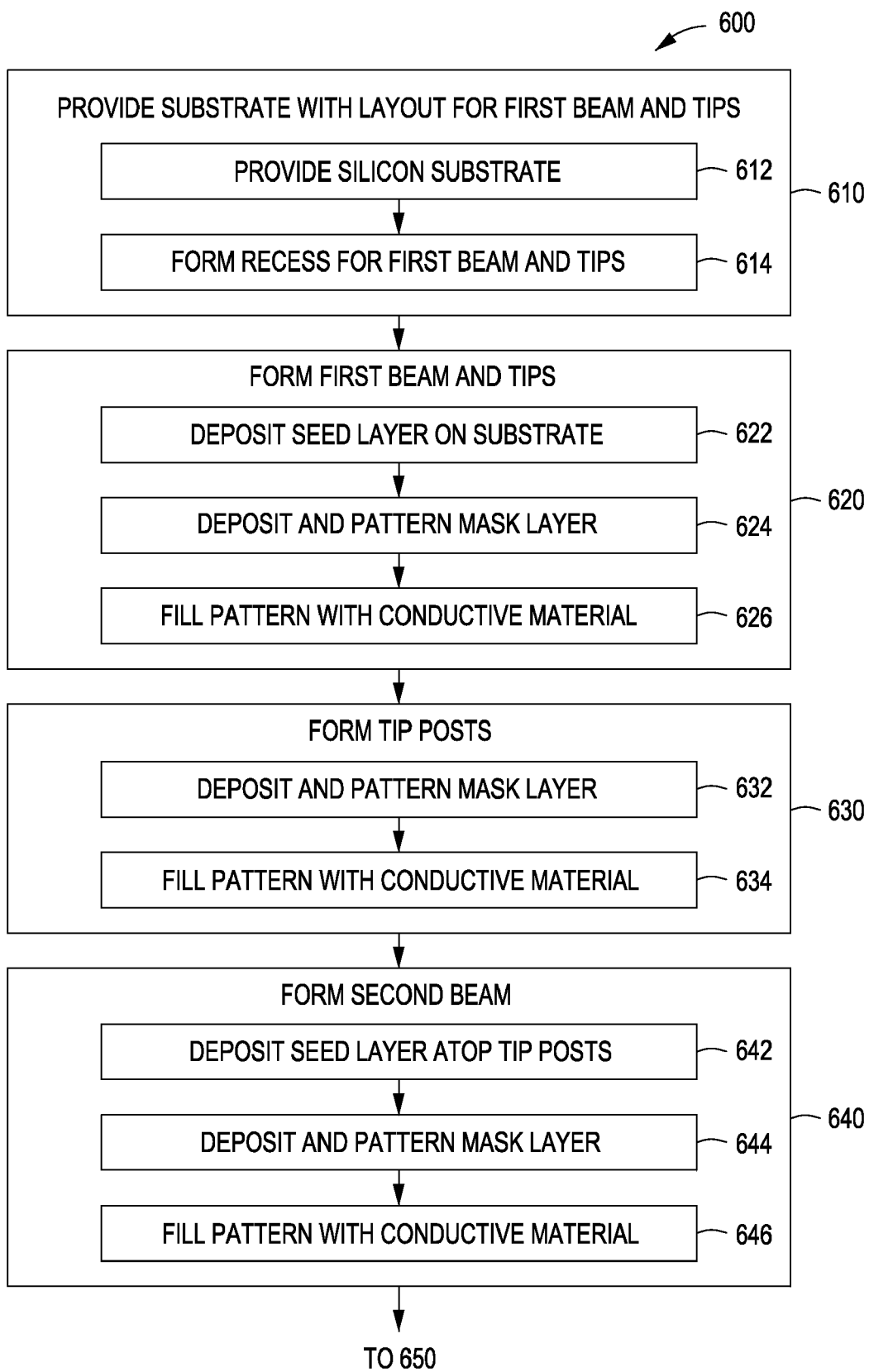
FIG. 6 depicts a flow chart of a method of fabricating a microspring array having reduced pitch contact elements in accordance with some embodiments of the invention.
Figure 6B:
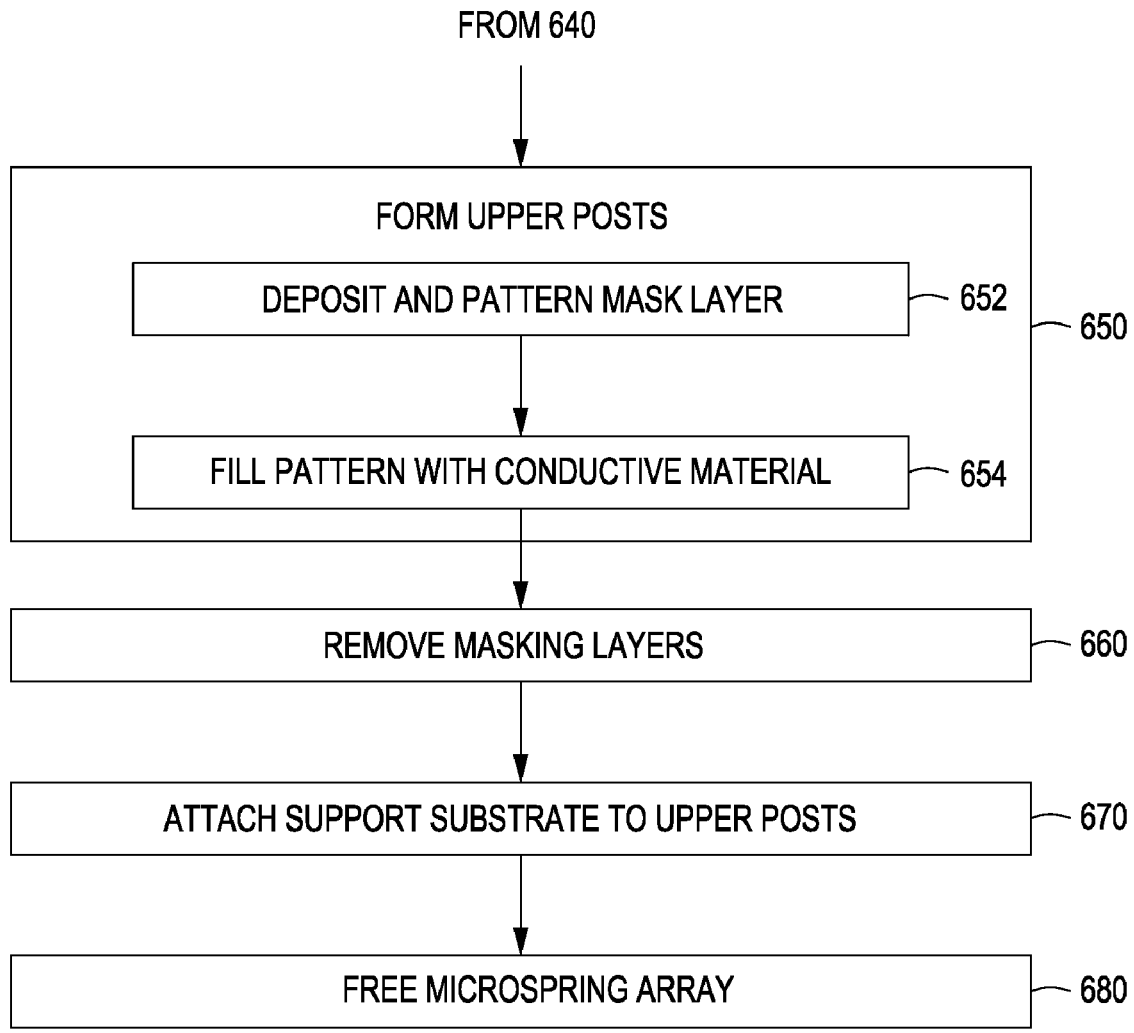

The configuration discussed above with respect to FIGS. 4 and 5A-I are illustrative only and other configurations are contemplated. For example, FIGS. 6 and 7A-G respectively depict a process flow chart and illustrative stages of fabrication of a microspring array in accordance with some embodiments of the present invention. FIG. 6 depicts a process 600 for fabricating a microspring array 700 (as shown in FIGS. 5A-I) in accordance with some embodiments of the invention and similar to microspring array 200 discussed above. To more easily understand aspects of the present invention, the following discussion with respect to FIGS. 6-7 reflect the fabrication of a pair of resilient contact elements of the microspring array. It is contemplated that the microspring array may have any number of resilient contact elements that may be simultaneously fabricated on a substrate utilizing any of the following methods. Moreover, although shown schematically in cross-section, the portions of the microspring array shown in any figure may not be aligned in the plane of the drawing (for example, as discussed above with respect to the offset first and second beams of FIGS. 2A-B and 3A-B), may have uniform or non uniform profiles (for example, the beams may have a tapered width, as discussed above with respect to FIGS. 2A-B and 3A-B).

Figure 7A:
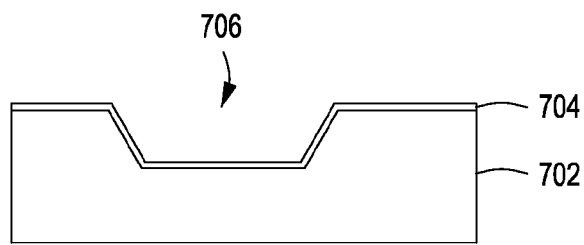
FIGS. 7A-G depict schematic side views of stages of fabrication of a microspring array having reduced pitch contact elements in accordance with some embodiments of the invention.

The exemplary process 600 begins at 602 wherein a substrate 702 can be provided having a tip and beam recess 706, as shown in FIG. 7A. The substrate 702 may comprise any suitable substrate, as discussed above, and in some embodiments comprises silicon. The substrate 702 may further have an oxide layer (not shown) formed at least partially thereover. The tip and beam recess 706 may be configured to conform to the bottom profile of the first beam and the tips of the microspring array (as discussed above with respect to FIGS. 2A-B and 3A-B). Although FIGS. 7A-G illustrate one type of tip and beam recess 706, other recess geometries for forming other types of beams and/or tips may similarly be used in various embodiments of the invention.

In some embodiments, the substrate 702 may be provided with the tip and beam recess 706. In some embodiments, a blank substrate 702 may be provided, as shown at 612, and the tip and beam recess 706 may be formed therein, as shown at 614. The tip and beam recess 706 may have angled sidewalls and may be formed in the substrate 702 by any suitable process, such as those discussed above with respect to FIG. 4. In some embodiments, a tip and beam recess 706 form the angled sidewalls may be formed using a wet etch with a solution of potassium hydroxide (KOH) as discussed above with respect to FIG. 4.

Next, at 720, a first beam and tips may be formed at least partially within the tip and beam recess 706. In some embodiments, prior to the formation of the first beam and tips, a seed layer 704 may be deposited over the substrate 702, including within the tip and beam recess 706, as shown at 622 and in FIG. 7B. The seed layer 704 typically comprises a material that facilitates subsequent deposition of the material to be utilized to form the first beam and the tips in the tip and beam recess 706. The seed layer 704 may comprise materials and may be deposited by techniques similar to those discussed above with respect to FIG. 4. In some embodiments, the seed layer 704 may comprise gold. In one non-limiting example, the seed layer 714 may comprise a layer of gold formed to a thickness of about 2 μm.

Figure 7B:
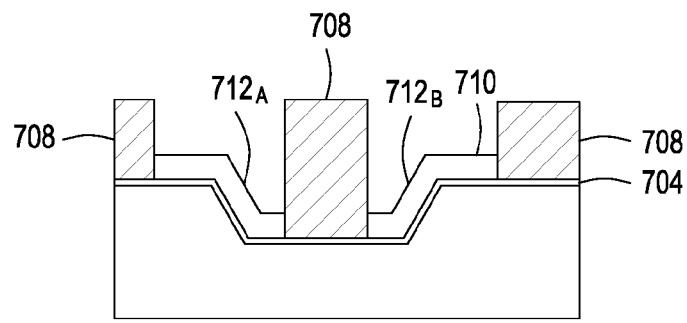

As shown at 624 and in FIG. 7B, a patterned mask layer 708 may be provided to define the first beam and the tips. The patterned mask layer 708 may comprise materials and may be formed using techniques similar to those discussed above with respect to FIG. 4. For example, such as by depositing and patterning a layer of dry film or liquid photoresist material atop the substrate 702 (all other mask layers described herein may be formed using materials and techniques similar to mask layer 708 unless stated otherwise). In some embodiments, the seed layer 704 may be deposited over the patterned mask layer 708 and into the tip and beam recess 706 rather than prior to formation of the patterned mask layer 708.

At 726, the pattern may be filled with a conductive material to define the first beam 710 and the tips 712$_A$ and 712$_B$. The first beam 710 and the tips 712$_A$ and 712$_B$ may be formed in any suitable manner, such as by plating or the like. Suitable non-limiting examples of materials which could be used for the first beam 710 and the tips 712$_{A-B}$ include the materials discussed above with respect to FIGS. 2A-B and 3A-B. In some embodiments, multiple layers of materials may be utilized to form the first beam 710 and the tips 712$_{A-B}$. For example, in some embodiments a first layer of conductive material may be formed within the pattern of the mask layer 708, such as a layer of a palladium-cobalt alloy, and a second layer of conductive material may be formed thereover, such as a layer of a nickel-cobalt alloy. It is contemplated that other materials or numbers of layers may also be utilized, including the use of non-conductive materials (so long as an electrical pathway is provided from the tip of the resilient contact element to the testing apparatus, as described in more detail below with respect to FIG. 8). In some embodiments, a thin layer of nickel and/or gold (not shown) may be formed, for example by strike plating, atop the first beam 710 and the tips 712$_{A-B}$.

The first beam 710 and the tips 712$_{A-B}$ are generally formed to a thickness suitable to ensure uniform coverage and, for example, to provide desired mechanical and electrical properties, as discussed above. For example, in a non-limiting example, the first beam and the tips may be provided having a thickness between about 10 to 20 μm.

Figure 7C:
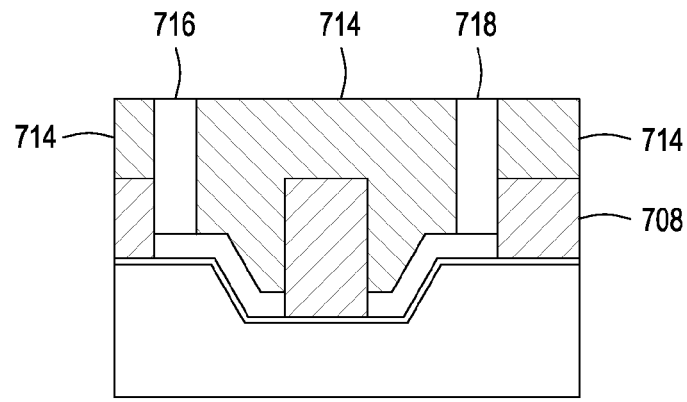

Next, at 630, post 716 and post 718 may be formed atop the first beam 710 and the tip 712$_A$, as shown in FIG. 7C. In some embodiments, a mask layer 714 may be deposited and patterned atop the mask layer 708, the first beam 71, and the tips 712$^{A-B}$ to define openings for the posts 718, 718, as shown at 632. The mask layer 714 may be formed by similar materials and techniques as discussed above with respect to the mask layer 708. At 634, the post patterns defined be the pattern in the mask layer 714 may be filled with a conductive material to form the post 716 and post 718.

Suitable non-limiting examples of materials which could be used to form the post 716 and post 718 include the materials discussed above with respect to FIGS. 2A-B and 3A-B. In some embodiments, a single layer of material may be utilized to form the post 716 and post 718. For example, in some embodiments a layer of conductive material may be formed within the patterned mask layer 714, such as a layer of a nickel-cobalt alloy. It is contemplated that other materials or numbers of layers may also be utilized, including the use of non-conductive materials (so long as an electrical pathway is provided from the tip of the resilient contact element to the testing apparatus, as described in more detail below with respect to FIG. 8). In some embodiments, a thin layer of nickel and/or gold (not shown) may be formed, for example by strike plating, atop the post 716 and post 718.

Figure 7D:
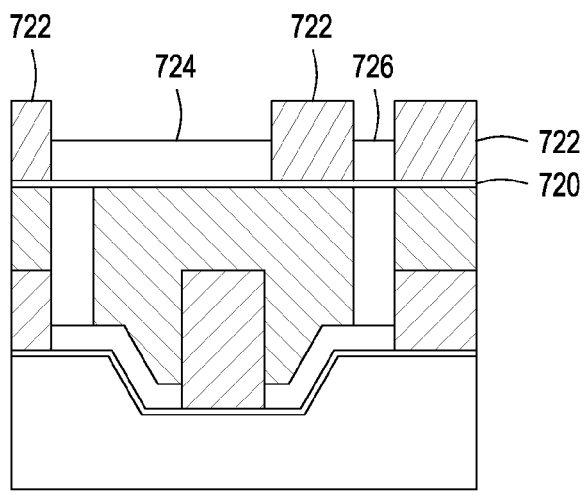

Next, at 640, a second beam 724 and a post spacer 726 may be formed atop the mask layer 714 and the posts 716, 718, as shown in FIG. 7D. In some embodiments, as shown at 642, a seed layer 720 may be deposited atop the mask layer 714 and the posts 716, 718. The seed layer 720 typically comprises a material that facilitates subsequent deposition of the material to be utilized to form the second beam 724 and the post spacer 726 and may be formed in a similar manner as discussed above with respect to forming the seed layers discussed above. In some embodiments, the seed layer may comprise gold. In one non-limiting example, the seed layer may comprise a layer of gold formed to a thickness of about 2 μm.

At 644, a mask layer 722 may be deposited and patterned atop the seed layer 720 to define an opening for the second beam 724 and the post spacer 726. In some embodiments, the mask layer 722 may be formed atop the mask layer 714 and the posts 716, 718, and a seed layer may be subsequently deposited atop the patterned mask layer 722 and into the openings formed therein. The mask layer 722 may be formed by similar materials and techniques as discussed above with respect to the mask layer 708.

At 646, the second beam 724 and the post spacer 726 may be formed by depositing material within the patterned mask layer 722 and atop the seed layer 720 (when present) to a desired thickness. Suitable non-limiting examples of materials which could be used for the beam include the materials discussed above with respect to FIGS. 2A-B and 3A-B. In some embodiments, a single layer of material may be utilized to form the second beam 724 and the post spacer 726. For example, in some embodiments a layer of conductive material may be formed within the patterned mask layer 722, such as a layer of a nickel-cobalt alloy. It is contemplated that other materials or numbers of layers may also be utilized, including the use of non-conductive materials (so long as an electrical pathway is provided from the tip of the resilient contact element to the testing apparatus, as described in more detail below with respect to FIG. 8). In some embodiments, a thin layer of nickel and/or gold (not shown) may be formed, for example by strike plating, atop the second beam 724 and the post spacer 726.

The second beam 724 and the post spacer 726 may generally be formed to a thickness suitable to ensure uniform coverage and, for example, to provide desired mechanical and electrical properties for the second beam 724 and the post spacer 726, as discussed above. For example, in a non-limiting example, the second beam 724 and the post spacer 726 may be formed to a thickness of between about 10 to 20 μm.

Figure 7E:
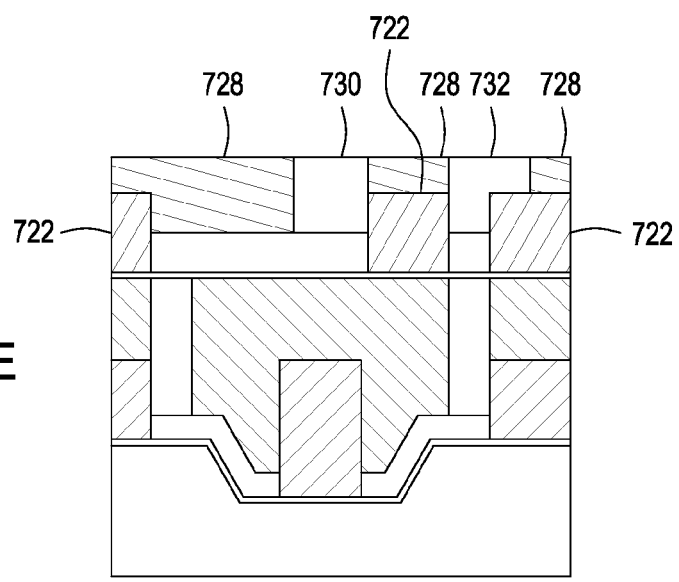

Next, at 650, upper posts 730, 732 may be formed atop the second beam 724 and the post spacer 726, as shown in FIG. 7E. At 652, a mask layer 728 may be deposited and patterned atop the mask layer 722, the second beam 724, and the post spacer 726 to define an opening for the upper posts 730, 732. The mask layer 728 may be formed by similar materials and techniques as discussed above with respect to the mask layer 708. At 654, the upper posts 730, 732 may be formed by depositing material within the patterned mask layer 728 and atop the second beam 724, and the post spacer 726 to a desired thickness. Suitable non-limiting examples of materials which could be used for the beam include the materials discussed above with respect to FIGS. 2A-B and 3A-B. In some embodiments, a single layer of material may be utilized to form the upper posts 730, 732. For example, in some embodiments a layer of conductive material may be formed within the patterned mask layer 728, such as a layer of a nickel-cobalt alloy. It is contemplated that other materials or numbers of layers may also be utilized, including the use of non-conductive materials (so long as an electrical pathway is provided from the tip of the resilient contact element to the testing apparatus, as described in more detail below with respect to FIG. 8). In some embodiments, a thin layer of nickel and/or gold (not shown) may be formed, for example by strike plating, atop the upper posts 730, 732.

Figure 7F:
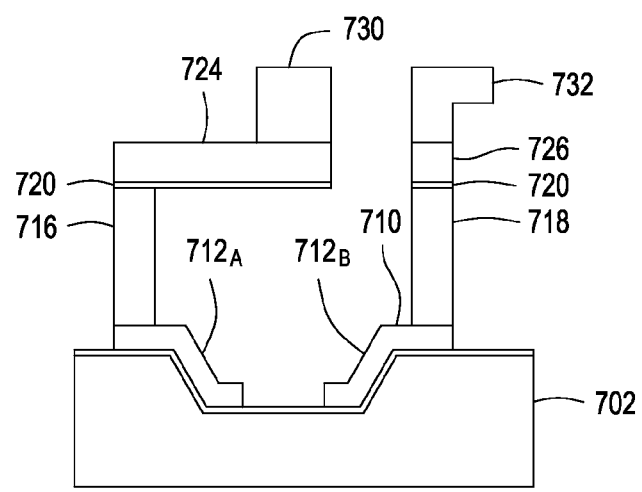

Next, at 660 the masking layers 708, 714, 722, and 728 may be removed, as shown in FIG. 7F. the masking layers 708, 714, 722, and 728 may be removed by any suitable process, such as those discussed above with respect to removing mask layers in FIG. 4.

Figure 7G:
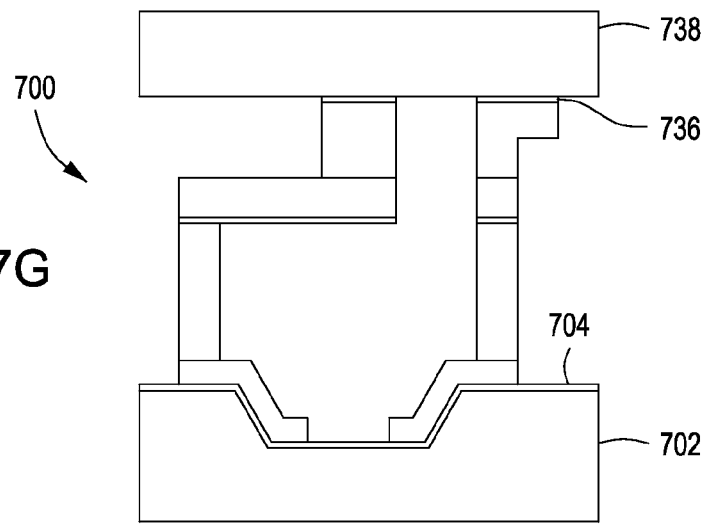

Next, at 670, a support substrate 738 may be attached to the upper posts 730, 732, as shown in FIG. 7G. The support substrate 738 may be attached to the upper posts 730, 732 by any suitable bonding agent, such as solder, brazing, or the like. In some embodiments, the support substrate 738 may be attached to the upper posts 730, 732 by a layer of solder 736 (for example, by applying a bead of solder atop each upper post 730, 732 and contacting the upper posts 730, 732 and the support substrate 738 together while applying sufficient heat to flow the solder). The support substrate 738 may be, for example, a support substrate utilized as a temporary support or to attach the completed microspring array to a probe card assembly or other testing apparatus, as discussed below with respect to FIG. 8. In some embodiments, the support substrate 738 may be a ceramic tile.

Next, at 680, the microspring array 700 may be freed from the substrate 702 using techniques similar to those discussed above with respect to freeing the microspring array 500. In some embodiments, the microspring array 700 may be freed from the substrate 702, for example, by etching the silicon away from the first beam 710 and tips 712$_{A-B}$. In some embodiments, the support substrate 738 may be singulated to separate the microspring array 700 from other microspring arrays being simultaneously formed in the process 600. Upon release of the microspring array 700 from the substrate 702, the process 600 ends and the microspring array 700 may be utilized, for example, as part of a probe card assembly for testing devices, as discussed below with respect to FIG. 8.

Figure 10A:
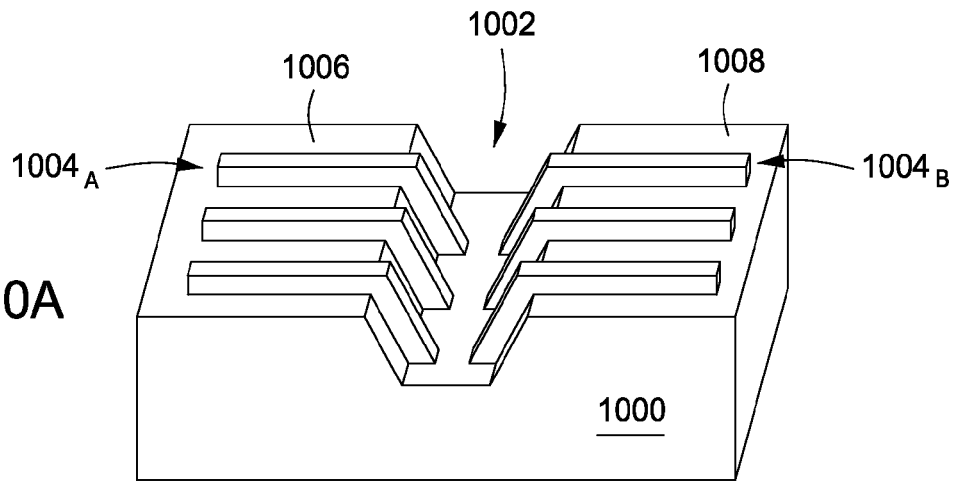
FIGS. 10A-C depict schematic perspective views of partially fabricated microspring arrays in accordance with some embodiments of the invention.
Figure 10B:
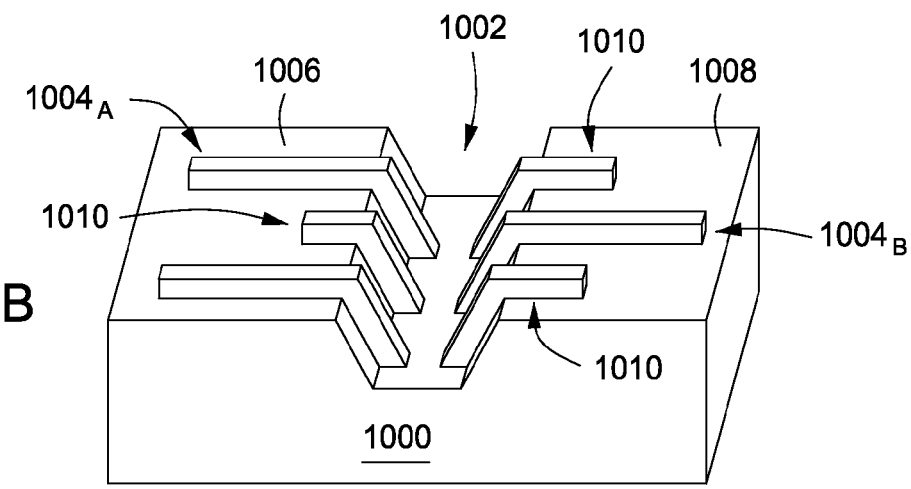

As discussed above, some embodiments of the inventive methods provided herein may also provide a process for fabricating a microspring array utilizing a substrate having a tip recess defining a trench in which the tips of a plurality of resilient contact elements may be simultaneously formed. For example, FIGS. 10A-C respectively depict portions of illustrative microspring array configurations being fabricated upon a substrate having a tip recess defining a trench. In some embodiments, and as depicted in FIG. 10A, a substrate 1000 may have a tip recess 1002 defining a trench in which the tips of a plurality of resilient contact elements 1004$_{A-B}$ (collectively 1004) may be simultaneously fabricated utilizing, for example, the fabrication techniques disclosed hereinabove. As depicted in FIG. 10A, a subset of the resilient contact elements 1004$_A$ may extend along the substrate 1000 on a first side 1006 of the tip recess 1002 and a subset of the resilient contact elements 1004$_B$ may extend along the substrate 1000 on a second side 1008 of the tip recess 1002, opposite the first side 1006. The resilient contact elements 1004 may be aligned, as depicted in FIG. 10A, or may be staggered, or offset from each other, as depicted in FIG. 10B. In some embodiments, the resilient contact elements 1004 may include dummy features 1010, as required, during the fabrication process. Of course, other configurations are possible, including those where some resilient contact elements 1004 are aligned and others are offset.

Figure 10C:
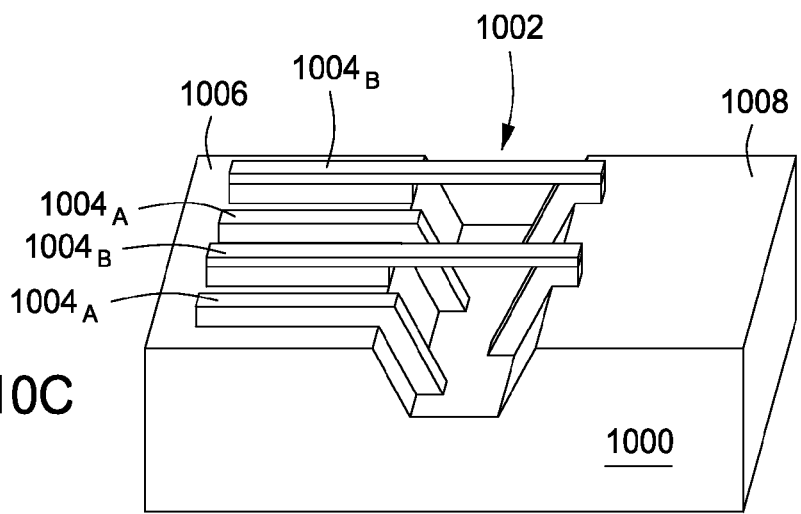

In some embodiments, as depicted in FIG. 10C, resilient contact elements 1004$_A$ and resilient contact elements 1004$_B$ may extend along the substrate 1000 on the same side of the tip recess 1002 (for example, on the first side 1006). A subset of the resilient contact elements 1004$_A$ may have tips at least partially defined by a first side of the tip recess adjacent the first side 1006 and a subset of the resilient contact elements 1004$_B$ may have tips at least partially defined by a second side of the tip recess adjacent the second side 1008. In some embodiments the two subsets of resilient contact elements 1004$_{A-B}$ may be offset in height to each other. The geometries and configurations shown in any of the embodiments depicted in FIGS. 10A-C may be combined and/or may be modified by the teachings disclosed above with respect to FIGS. 4-7 (such as, for example, to include a beam recess as discussed above with respect to FIGS. 4 and 5A-I).

Figure 11:
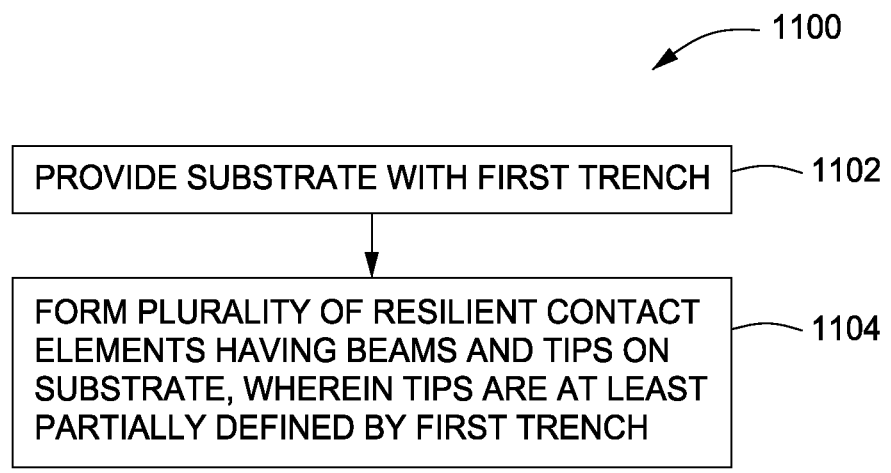
FIG. 11 depicts a flow chart of a method of fabricating a microspring array in accordance with some embodiments of the invention.

Such microspring arrays may be fabricated utilizing any of the techniques and materials disclosed above, for example, in a process 1100 depicted in FIG. 11. The process 1100 generally begins at 1102 where a substrate having a first trench is provided. The substrate may be any of the substrates discussed above (e.g., 502, 702, 1000, and variants thereof) and the first trench may be, for example, any of the tip recesses discussed above (e.g., 508, 706, 902, 904, 1002, and variants thereof). Next, at 1104, a plurality of resilient contact elements having beams and tips may be formed on the substrate, wherein the tips are at least partially defined by the first trench. The inventive methods disclosed hereinabove may be utilized to fabricate the resilient contact elements at 1104 to form a microspring array having a desired geometry.

The inventive microspring arrays and methods of fabrication disclosed herein provide numerous advantages over conventional microspring arrays. For example, the present microspring arrays have resilient contact elements with integral beams and tips, thereby reducing the incidence of broken or missing tips, and thereby reducing the amount of downtime of systems incorporating the inventive microspring arrays due to tip replacement or repair. In addition, the downward, angled configuration of the tips provide an integral tip with wiping capability for robust contact with terminals of the DUT. Moreover, the beams and the tips of the microspring array are supported and fixed in place upon the substrate during fabrication, which may facilitate more precise locating of the tips of the microspring array. Furthermore, the present integral lithographic fabrication processes result in a reduced number of parts and/or steps of fabrication, thereby simplifying and reducing the cost of fabrication, even while providing a three-dimensional, or topographic, beam and tip configuration flexibility.

The present inventive microspring arrays may be advantageously utilized in probe card assemblies or other testing apparatus. For example, FIG. 8 depicts a schematic view of an illustrative probe card assembly 800 having one or more microspring arrays 200 (or microspring arrays 500, 700) as described herein, according to some embodiments of the invention. The exemplary probe card assembly 800 illustrated in FIG. 8 can be used to test one or more electronic devices (represented by DUT 828). The DUT 828 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, refers to one or a plurality of such electronic devices.

The probe card assembly 800 generally acts as an interface between a tester (not shown) and the DUT 828. The tester, which can be a computer or a computer system, typically controls testing of the DUT 828, for example, by generating test data to be input into the DUT 828, and receiving and evaluating response data generated by the DUT 828 in response to the test data. The probe card assembly 800 includes electrical connectors 804 configured to make electrical connections with a plurality of communications channels (not shown) from the tester. The probe card assembly 800 also includes one or more microspring arrays 200 configured to be pressed against, and thus make electrical connections with, one or more input and/or output terminals 820 of DUT 828. The microspring arrays 200 are typically configured to correspond to the terminals 820 of the DUT 828 and may have a desired geometry as discussed above. For example, in some embodiments, the microspring array may be configured to test DUTs 828 having terminals 820 with pitches of as low as about 35 µm.

The probe card assembly 800 may include one or more substrates configured to support the connectors 804 and the microspring arrays 200 and to provide electrical connections therebetween. The exemplary probe card assembly 800 shown in FIG. 8 has three such substrates, although in other implementations, the probe card assembly 800 can have more or fewer substrates. In the embodiment depicted in FIG. 8, the probe card assembly 800 includes a wiring substrate 802, an interposer substrate 808, and a probe substrate 824. The wiring substrate 802, the interposer substrate 808, and the probe substrate 824 can generally be made of any type of suitable material or materials, such as, without limitation, printed circuit boards, ceramics, organic or inorganic materials, and the like, or combinations thereof.

Electrically conductive paths (not shown) may be provided from the connectors 804 through the wiring substrate 802 to a plurality of electrically conductive spring interconnect structures 806. Other electrically conductive paths (not shown) may be provided from the spring interconnect structures 806 through the interposer substrate 808 to a plurality of electrically conductive spring interconnect structures 819. Still other electrically conductive paths (not shown) may further be provided from the spring interconnect structures 819 through the probe substrate 824 to the microspring arrays 200. The electrically conductive paths through the wiring substrate 802, the interposer substrate 808, and the probe substrate 824 can comprise electrically conductive vias, traces, or the like, that may be disposed on, within, and/or through the wiring substrate 802, the interposer substrate 808, and the probe substrate 824.

The wiring substrate 802, the interposer substrate 808, and the probe substrate 824 may be held together by one or more brackets 822 and/or other suitable means (such as by bolts, screws, or other suitable fasteners). The configuration of the probe card assembly 800 shown in FIG. 8 is exemplary only and is simplified for ease of illustration and discussion and many variations, modifications, and additions are contemplated. For example, a probe card assembly may have fewer or more substrates (e.g., 802, 808, 824) than the probe card assembly 800 shown in FIG. 8. As another example, a probe card assembly may have more than one probe substrate (e.g., 824), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 800 shown in FIG. 8 and that the probe card assemblies described in the aforementioned patents and application may benefit from the use of the inventive resilient contact elements disclosed herein. FIG. 8 depicts just one illustrative example of the types of probe card assemblies that may incorporate resilient contact elements as described herein and many other probe card assemblies having various configurations are within the scope of this invention.

For example, one illustrative process for testing a DUT with a probe card assembly having resilient contact elements according to some embodiments of the invention can be described with respect to the probe card assembly 800 described above with respect to FIG. 8 and the microspring arrays 200 described above with respect to FIGS. 2A-B. The method begins where a probe card assembly 800 is provided. The probe card assembly 800 has a plurality of resilient contact elements disposed thereon for testing the DUT. At least some of the resilient contact elements may be arranged in a microspring array (such as microspring arrays 200, 500, 700, or variants thereof, as described herein). For example, the microspring arrays 200 may include a plurality of lithographically formed resilient beams 204 having tips 206 extending therefrom at a non-zero, non-perpendicular angle within a central region 222 defined between the respective ends of the beams 204. The tips 206 and the beams 204 are configured to electrically probe a device to be tested (e.g., DUT 828). The DUT 828 may generally be disposed upon a movable support within a test system (not shown).

Next, the terminals 820 of the DUT 828 are brought into contact with the tips 104 of the resilient contact elements. The resilient contact elements can be brought into contact with the terminals 820 of the DUT 828 by moving at least one of the DUT 828 or the probe card assembly 800. Typically, the DUT 828 is disposed on a movable support disposed in the test system (not shown) that moves the DUT 828 into sufficient contact with the resilient contact elements to provide reliable electrical contact with the terminals 820.

When moving the DUT 828 to contact the resilient contact elements of the probe card assembly 800, the DUT 828 typically continues to move towards the probe card assembly 800 until all of the resilient contact elements 202 of the microspring arrays 200 come into sufficient electrical contact with the terminals 820.

Once contact is made, the DUT 828 may be tested per a pre-determined protocol, for example, as contained in the memory of the tester. For example, the tester may generate power and test signals that are provided through the probe card assembly 800 to the DUT 828. Response signals generated by the DUT 828 in response to the test signals are similarly carried through the probe card assembly 800 to the tester, which may then analyze the response signals and determine whether the DUT 828 responded correctly to the test signals. Upon completion of testing, the method ends.

Thus methods and apparatus suitable for testing devices having reduced feature sizes (e.g., 35 µm or lower), and methods for fabricating same, have been provided herein. The inventive apparatus and methods can provide increased contact element density and reduced pitch as compared to conventional testing apparatus, which can facilitate testing of devices having reduced contact feature sizes. For example, in some embodiments, an about 50 percent reduction in perimeter pad probing pitch may be provided. It is contemplated that the inventive apparatus and methods may also be used to advantage in testing devices having larger feature sizes as well. Embodiments of the present invention may further advantageously permit testing of terminals having various configurations, such as in-line or staggered pad probing.

While the foregoing is directed to embodiments of the present invention, other and further embodiments of the invention may be devised without departing from the basic scope thereof, and the scope thereof is determined by the claims that follow.

The invention claimed is:

1. A probe card assembly, comprising:
a substrate; and
a microspring array coupled to the substrate, the microspring array comprising:
a lithographically formed resilient first contact element comprising a first beam elongate in a first direction from a first end of the first beam to a first contact tip extending in a second direction, different than the first direction, from the first beam; and
a lithographically formed resilient second contact element comprising a second beam elongate in a third direction from a first end of the second beam to a second contact tip extending in a fourth direction, different than the third direction, from the second beam,
wherein:
the first direction is substantially the same as the third direction, and
the second direction is different than the fourth direction.

2. The probe card assembly of claim 1, wherein the first beam and the second beam are supported relative to each other by an organic material.

3. The probe card assembly of claim 1, wherein the first beam tapers towards the first contact tip, and the second beam tapers towards the second contact tip.

4. The probe card assembly of claim 3, wherein the first beam tapers towards the first contact tip at a ratio of about 2:1, and the second beam tapers towards the second contact tip at a ratio of about 2:1.

5. The probe card assembly of claim 1, wherein the first contact tip and the second contact tip are staggered in two rows.

6. The probe card assembly of claim 1, wherein the first contact tip and the second contact tip have pitch of about 35 micrometers.

7. The probe card assembly of claim 1, further comprising:
a first post disposed on the first end of the first beam and coupled to the substrate; and
a second post disposed on the first end of the second beam and coupled to the substrate.

8. The probe card assembly of claim 7, further comprising:
a ceramic tile coupled to:
the first beam on a first side of the ceramic tile and having the first post extending therethrough to a second side of the ceramic tile, opposite the first side, and
the second beam on the first side of the ceramic tile and having the second post extending therethrough to the second side of the ceramic tile.

9. The probe card assembly of claim 1, wherein the first contact tip and the second contact tip are configured to wipe the surface of contact terminals.

10. The probe card assembly of claim 1, wherein a portion of the first beam overlaps a portion of the second beam.

11. The probe card assembly of claim 1, wherein the first contact tip and the second contact tip extend in opposite directions with respect to each other.

12. The probe card assembly of claim 1, wherein:
the first contact tip extends from a second end of the first beam that is opposite the first end of the first beam, and
the second contact tip extends from a second end of the second beam that is opposite the first end of the second beam.

13. The probe card assembly of claim 12, wherein:
the first contact tip extends from the second end of the first beam into a space between the second end of the first beam and the second end of the second beam, and
the second contact tip extends from the second end of the second beam into the space.

14. The probe card assembly of claim 1, wherein:
the second direction comprises a first component parallel to and in the same direction as the first direction and a second component perpendicular to the first direction, and
the fourth direction comprises a first component parallel to and in the opposite direction as the third direction and a second component perpendicular to the third direction.

15. A microspring array, comprising:

a lithographically formed resilient first contact element comprising a first beam elongate in a first direction from a first end of the first beam to a first contact tip extending in a second direction, different than the first direction, from the first beam; and a lithographically formed resilient second contact element comprising a second beam elongate in a third direction from a first end of the second beam to a second contact tip extending in a fourth direction, different than the third direction, from the second beam, wherein:

the first direction is substantially the same as the third direction, and the second direction is different than the fourth direction.

16. The microspring array of claim 15, wherein the first beam and the second beam are supported relative to each other by an organic material.

17. The microspring array of claim 15, wherein the first beam tapers towards the first contact tip, and the second beam tapers towards the second contact tip.

18. The microspring array of claim 17, wherein the first beam tapers towards the first contact tip at a ratio of about 2:1, and the second beam tapers towards the second contact tip at a ratio of about 2:1.

19. The microspring array of claim 15, wherein the first contact tip and the second contact tip are staggered in two rows.

20. The microspring array of claim 15, wherein the first contact tip and the second contact tip have pitch of about 35 micrometers.

21. The microspring array of claim 15, further comprising: a first post disposed on the first end of the first beam; and a second post disposed on the first end of the second beam.

22. The microspring array of claim 21, further comprising: a ceramic tile coupled to:
the first beam on a first side of the ceramic tile and having the first post extending therethrough to a second side of the ceramic tile, opposite the first side, and
the second beam on the first side of the ceramic tile and having the second post extending therethrough to the second side of the ceramic tile.

23. The microspring array of claim 15, wherein the first contact tip and the second contact tip are configured to wipe the surface of contact terminals.

24. The microspring array of claim 15, wherein a portion of the first beam overlaps a portion of the second beam.

25. The microspring array of claim 15, wherein the first contact tip and the second contact tip extend in opposite directions with respect to each other.

26. The probe card assembly of claim 15, wherein:
the first contact tip extends from the first beam at a non-perpendicular angle away from the first end of the first beam, and
the second contact tip extends from the second beam at a non-perpendicular angle towards the first end of the second beam.

27. The microspring array of claim 15, wherein:
the first contact tip extends from the first beam at a non-perpendicular angle away from the first end of the first beam, and
the second contact tip extends from the second beam at a non-perpendicular angle towards the first end of the second beam.

28. The microspring array of claim 15, wherein:
the first contact tip extends from a second end of the first beam that is opposite the first end of the first beam, and
the second contact tip extends from a second end of the second beam that is opposite the first end of the second beam.

29. The microspring array of claim 28, wherein:
the first contact tip extends from the second end of the first beam into a space between the second end of the first beam and the second end of the second beam, and
the second contact tip extends from the second end of the second beam into the space.

30. The microspring array of claim 15, wherein:
the second direction comprises a first component parallel to and in the same direction as the first direction and a second component perpendicular to the first direction, and
the fourth direction comprises a first component parallel to and in the opposite direction as the third direction and a second component perpendicular to the third direction.

* * * * *